United States Patent
Konishi et al.

(10) Patent No.: US 10,620,723 B2
(45) Date of Patent: Apr. 14, 2020

(54) INPUT DEVICE

(71) Applicant: Panasonic Intellectual Property Management Co., Ltd., Osaka (JP)

(72) Inventors: Toshihiro Konishi, Hyogo (JP); Hidenori Katsumura, Hyogo (JP); Masahisa Niwa, Osaka (JP); Takefumi Inoue, Nara (JP); Hideki Takahashi, Osaka (JP); Masaki Sawada, Osaka (JP)

(73) Assignee: Panasonic Intellectual Property Management Co., Ltd., Osaka (JP)

(\*) Notice: Subject to any disclaimer, the term of this patent is extended or adjusted under 35 U.S.C. 154(b) by 7 days.

(21) Appl. No.: 16/067,413

(22) PCT Filed: Jan. 11, 2017

(86) PCT No.: PCT/JP2017/000536
§ 371 (c)(1),
(2) Date: Jun. 29, 2018

(87) PCT Pub. No.: WO2017/122648
PCT Pub. Date: Jul. 20, 2017

(65) Prior Publication Data
US 2019/0025944 A1 Jan. 24, 2019

(30) Foreign Application Priority Data

Jan. 14, 2016 (JP) .................. 2016-005590

(51) Int. Cl.
*G09G 5/00* (2006.01)
*G06F 3/0362* (2013.01)
(Continued)

(52) U.S. Cl.
CPC ............ *G06F 3/0362* (2013.01); *G06F 1/169* (2013.01); *G06F 1/1698* (2013.01); *G06F 3/016* (2013.01);
(Continued)

(58) Field of Classification Search
CPC ..................................... G06F 3/0362
See application file for complete search history.

(56) References Cited

U.S. PATENT DOCUMENTS 5,555,894 A \* 9/1996 Doyama ................ A61B 5/225
128/925
2005/0275625 A1\* 12/2005 Koenig ................... G06F 3/033
345/156
(Continued)

FOREIGN PATENT DOCUMENTS

JP 2001-249758 A 9/2001
JP 2007-018041 A 1/2007
(Continued)

OTHER PUBLICATIONS

International Search Report issued in Application No. PCT/JP2017/000536 dated Mar. 28, 2017, with English translation.

*Primary Examiner* — Nan-Ying Yang
(74) *Attorney, Agent, or Firm* — McDermott Will & Emery LLP

(57) ABSTRACT

An input device includes a housing, an operation unit, a vibrating body, a piezoelectric element, a picker, and a signal processing unit. The operation unit is movable relative to the housing. The vibrating body has elasticity. The vibrating body includes a first end partially fixed to the housing, and a second end provided so as to be vibratable. The piezoelectric element is provided to the vibrating body. The piezoelectric element is configured to convert vibration energy of the vibrating body into electrical energy as the vibrating body vibrates. The picker flicks the vibrating body (Continued)

to allow the vibrating body to vibrate in conjunction with the operation unit. The signal processing unit is configured to receive power generated by the piezoelectric element to operate and transmit, through wireless communications, detection information to be generated as the operation unit moves.

13 Claims, 13 Drawing Sheets

(51) Int. Cl.
 G06F 3/038 (2013.01)
 G06F 1/16 (2006.01)
 H01H 19/00 (2006.01)
 G06F 3/0338 (2013.01)
 G06F 3/01 (2006.01)
 G06F 3/039 (2013.01)
 H01L 41/113 (2006.01)

(52) U.S. Cl.
 CPC ............ *G06F 3/038* (2013.01); *G06F 3/0338* (2013.01); *G06F 3/0383* (2013.01); *G06F 3/0393* (2019.05); *H01H 19/00* (2013.01); *H01L 41/113* (2013.01); *G06F 2203/0384* (2013.01)

(56) References Cited

U.S. PATENT DOCUMENTS

| | | | | |
|---|---|---|---|---|
| 2011/0025543 | A1* | 2/2011 | Takano | G08C 17/00 341/176 |
| 2014/0300531 | A1* | 10/2014 | Hong | G06F 3/017 345/156 |
| 2015/0033195 | A1* | 1/2015 | Jin | A61B 8/467 715/863 |

FOREIGN PATENT DOCUMENTS

| | | |
|---|---|---|
| JP | 2012-035782 A | 2/2012 |
| JP | 2014-162304 A | 9/2014 |
| JP | 2015-170231 A | 9/2015 |

\* cited by examiner

INPUT DEVICE

RELATED APPLICATIONS

This application is a national stage of International Application No. PCTJP2017/000536 filed Jan. 11, 2017, which claims the benefit of Japanese Application No. 2016-005590, filed on Jan. 14, 2016, the disclosures of which are incorporated in their entirety by reference herein.

TECHNICAL FIELD

The present invention relates to an input device configured to output information detected as an operation unit moves.

BACKGROUND ART

As a conventional input device, the input device of PTL 1 is known. The input device of PTL 1 is used for an on-vehicle device including a touch panel. The input device of PTL 1 includes a rotary operation unit. The operation unit includes a terminal that comes into contact with the touch panel. Along with a rotation operation, the terminal moves on the touch panel of the on-vehicle device. The touch panel is configured to detect an amount of movement of the terminal to operate the on-vehicle device. In other words, the input device described in PTL 1 is configured so that the touch panel is indirectly operated.

CITATION LIST

Patent Literature

PTL 1: Unexamined Japanese Patent Publication No. 2012-35782

SUMMARY OF THE INVENTION

An input device according to the present invention includes a housing, an operation unit, a vibrating body, a picker, a piezoelectric element, and a signal processing unit. The operation unit is provided so as to be movable relative to the housing. The vibrating body has elasticity, and includes a first end fixed to the housing. The picker is provided so as to be movable relative to the housing in conjunction with the operation unit. When the picker flicks the vibrating body, the vibrating body vibrates. The piezoelectric element is provided to the vibrating body. The piezoelectric element is configured to convert vibration energy of the vibrating body into electrical energy. The signal processing unit is configured to receive power generated by the piezoelectric element to operate and transmit, through wireless communications, detection information to be generated as the operation unit moves.

In this configuration, as the operation unit moves relative to the housing, the picker flicks the vibrating body. The piezoelectric element then converts vibration energy of the flicked vibrating body into electrical energy. The signal processing unit operates with power converted by the piezoelectric element. The signal processing unit then transmits, through wireless communications, detection information to be generated as the operation unit moves.

Therefore, the present invention can detect, without using a touch panel, an operation performed with the operation unit.

DESCRIPTION OF EMBODIMENTS

Prior to describing exemplary embodiments of the present invention, problems found in conventional input devices will now be described. A conventional input device uses a touch panel for detecting an amount of movement. The touch panel is therefore always necessary for the input device for detecting an operation. In other words, without using a touch panel, the conventional input device cannot detect an operation performed with the operation unit.

An object of the present invention is to provide an input device capable of detecting, without using a touch panel, an operation performed with an operation unit.

Input devices according to the exemplary embodiments of the present invention will now be described with reference to the accompanying drawings. It should be noted that the configurations described below are merely examples of the present invention, and the present invention is not limited to the following exemplary embodiments.

Therefore, besides the following exemplary embodiments, various modifications are possible depending on design or the like without departing from the scope of the technical idea of the present invention.

First Exemplary Embodiment

(1) Outline

Figure 1:
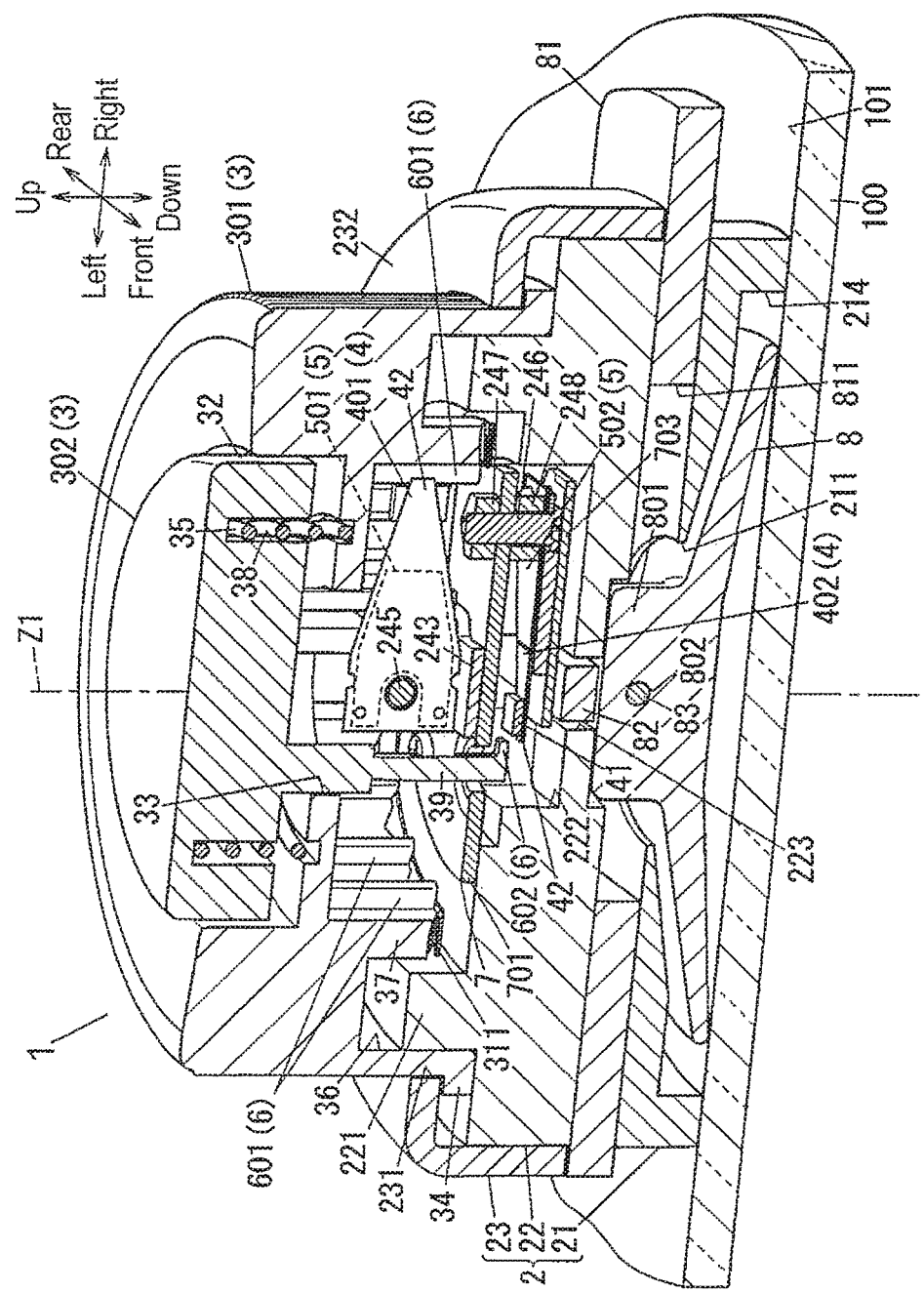
FIG. 1 is a cross-sectional perspective view of an input device according to a first exemplary embodiment of the present invention.
Figure 2:
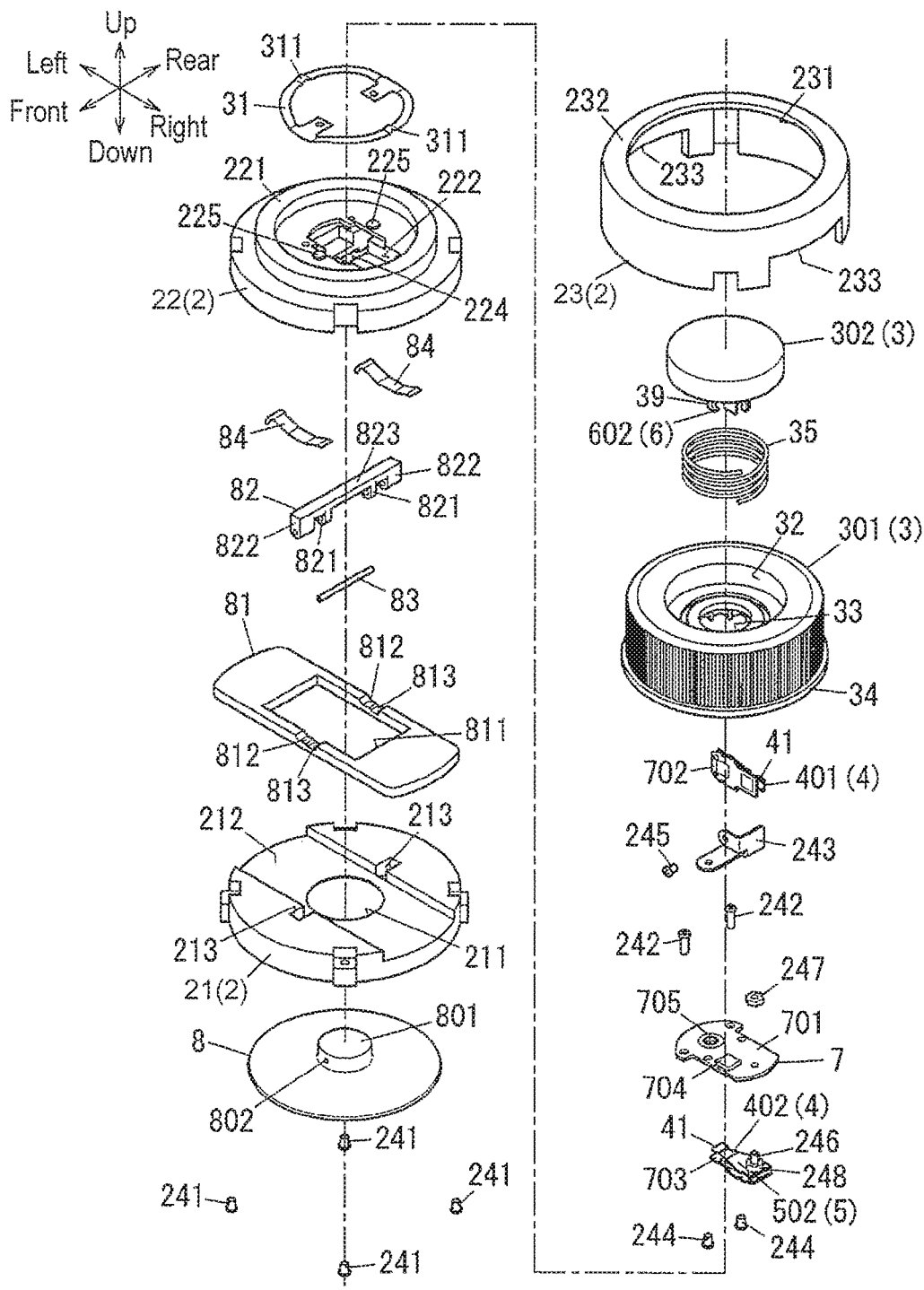
FIG. 2 is an exploded perspective view of the input device illustrated in FIG. 1.

An input device according to a first exemplary embodiment will now be described with reference to FIGS. 1 and 2. FIG. 1 is a cross-sectional perspective view of the input device according to the first exemplary embodiment of the present invention. FIG. 2 is an exploded perspective view of the input device illustrated in FIG. 1.

Input device 1 includes housing 2, operation units 3, vibrating bodies 4, piezoelectric elements 5, pickers 6, and signal processing unit 7.

Operation units 3 are each provided so as to be movable relative to housing 2. Vibrating bodies 4 have elasticity. Vibrating bodies 4 each include a first end fixed to housing 2, and a second end unfixed (i.e., vibratable) to housing 2. Piezoelectric elements 5 are provided to vibrating bodies 4. Piezoelectric elements 5 are configured to convert vibration energy of vibrating bodies 4 into electrical energy as vibrating bodies 4 vibrates. Pickers 6 are provided at positions where pickers 6 move together with operation units 3. Pickers 6 then flick vibrating bodies 4 to allow vibrating bodies 4 to vibrate. Signal processing unit 7 is configured to receive power generated by piezoelectric elements 5 to operate. Signal processing unit 7 is further configured to transmit, through wireless communications, detection information to be generated as each of operation units 3 moves.

Vibrating bodies 4 and piezoelectric elements 5 are separate members. In other words, each of vibrating bodies 4 and each of piezoelectric elements 5 are coupled to each other. However, each of vibrating bodies 4 and each of piezoelectric elements 5 may be integrated into a single member. In other words, each of piezoelectric elements 5 may be provided to each of vibrating bodies 4 as long as vibration energy of vibrating bodies 4 can be converted into electrical energy.

One or more of pickers 6 and each of operation units 3 are integrated into a single member. However, pickers 6 and operation units 3 may be separate members, and one or more of pickers 6 may be coupled to each of operation units 3. For example, one or more of pickers 6 may be mechanically coupled to each of operation units 3 via a link so as to move together. In other words, pickers 6 may be configured to at least move together with operation units 3.

Figure 3:
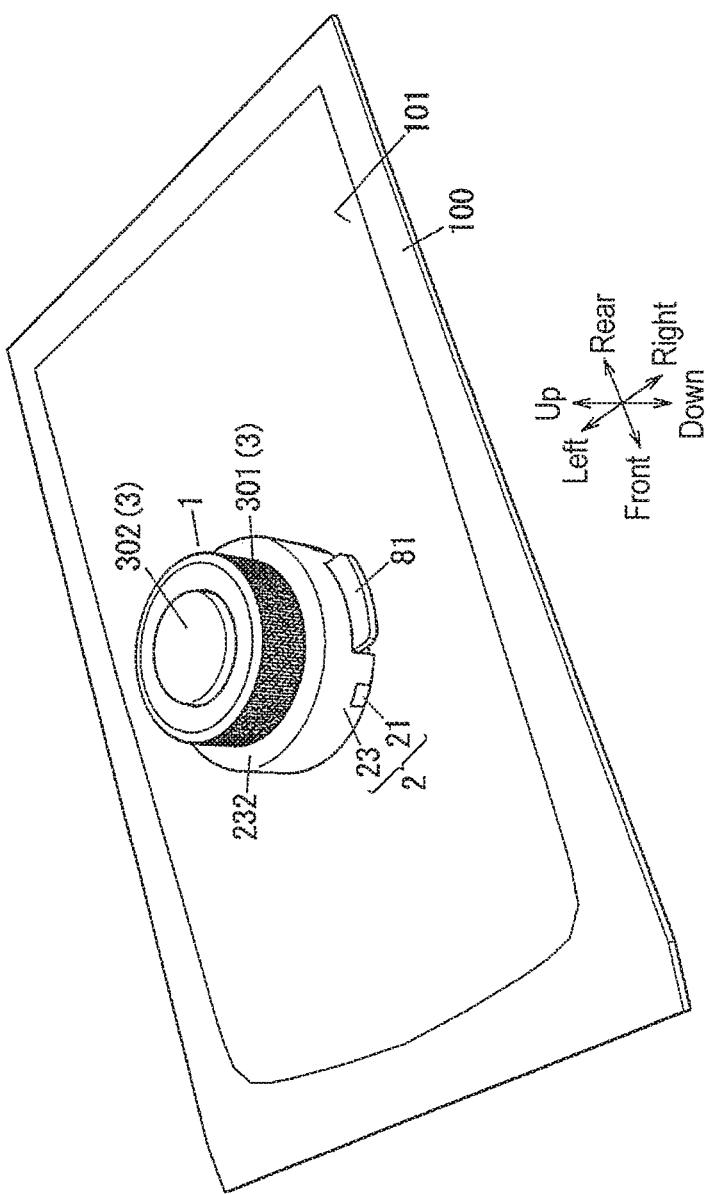
FIG. 3 is a perspective view illustrating a state that the input device illustrated in FIG. 1 is used.

Input device 1 is used to operate an operation-target device. Detection information generated in input device 1 is transmitted, through wireless communications, to the operation-target device. In other words, when one of operation units 3 is operated, input device 1 transmits detection information to the operation-target device. The operation-target device may be, for example, display device 100 illustrated in FIG. 3. FIG. 3 is a perspective view illustrating a state that the input device illustrated in FIG. 1 is used.

With the above described configuration, input device 1 can operate the operation-target device through operations performed with operation units 3, even if no electrical wire, for example, is used to couple input device 1 and the operation-target device. Therefore, input device 1 can detect, without using a touch panel, operations performed with operation units 3.

(2) Detail

Figure 4A:
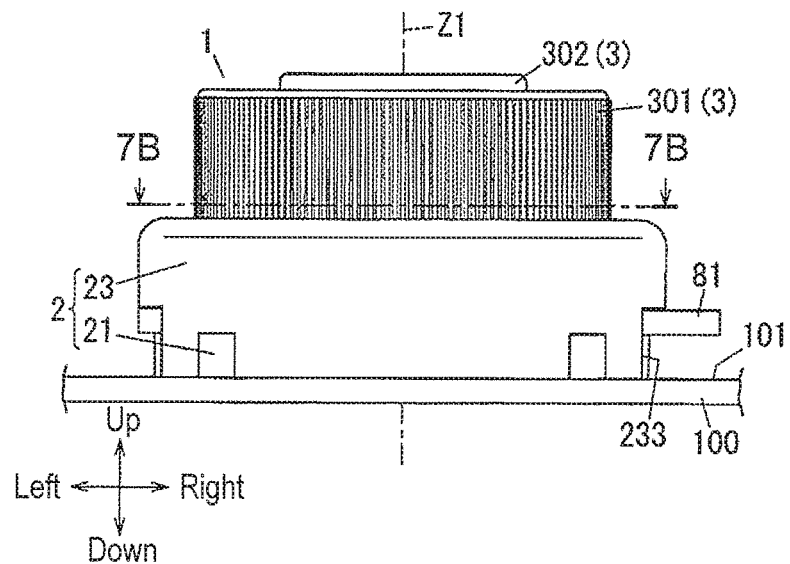
FIG. 4A is a front view of the input device in FIG. 1.
Figure 4B:
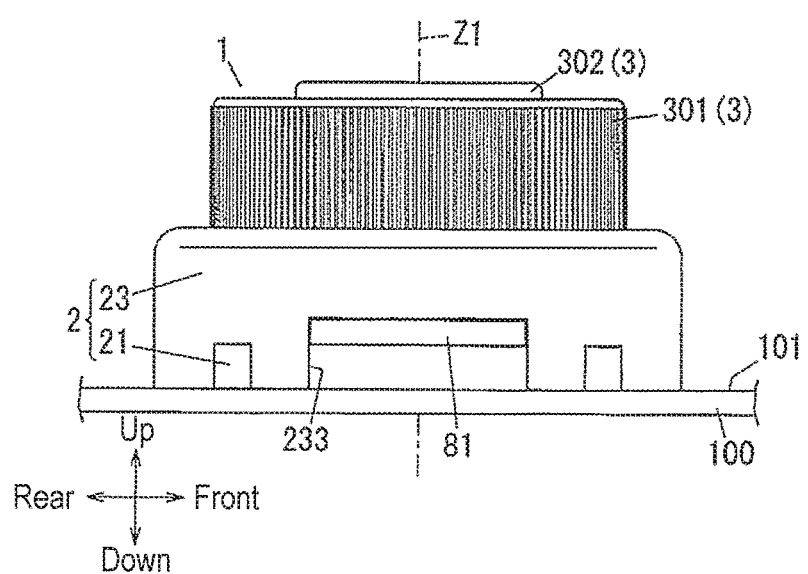
FIG. 4B is a left side view of the input device in FIG. 1.

Input device 1 will now be described in detail with reference to FIGS. 3, 4A, and 4B. FIG. 3 is a perspective view illustrating a state that the input device illustrated in FIG. 1 is used. FIG. 4A is a front view of the input device in FIG. 1. FIG. 4B is a left side view of the input device in FIG. 1.

Input device 1 is attached to the operation-target device for use. The operation-target device is display device 100, in this example. Input device 1 is attached to attaching surface 101 of the operation-target device. When the operation-target device is display device 100, attaching surface 101 is a display surface (display screen) of display device 100. When one of operation units 3 is operated, input device 1 transmits, through wireless communications, detection information to display device 100. Therefore, even when input device 1 is not coupled to display device 100 with an electrical wire, for example, input device 1 can function as an input interface for display device 100.

Figure 6:
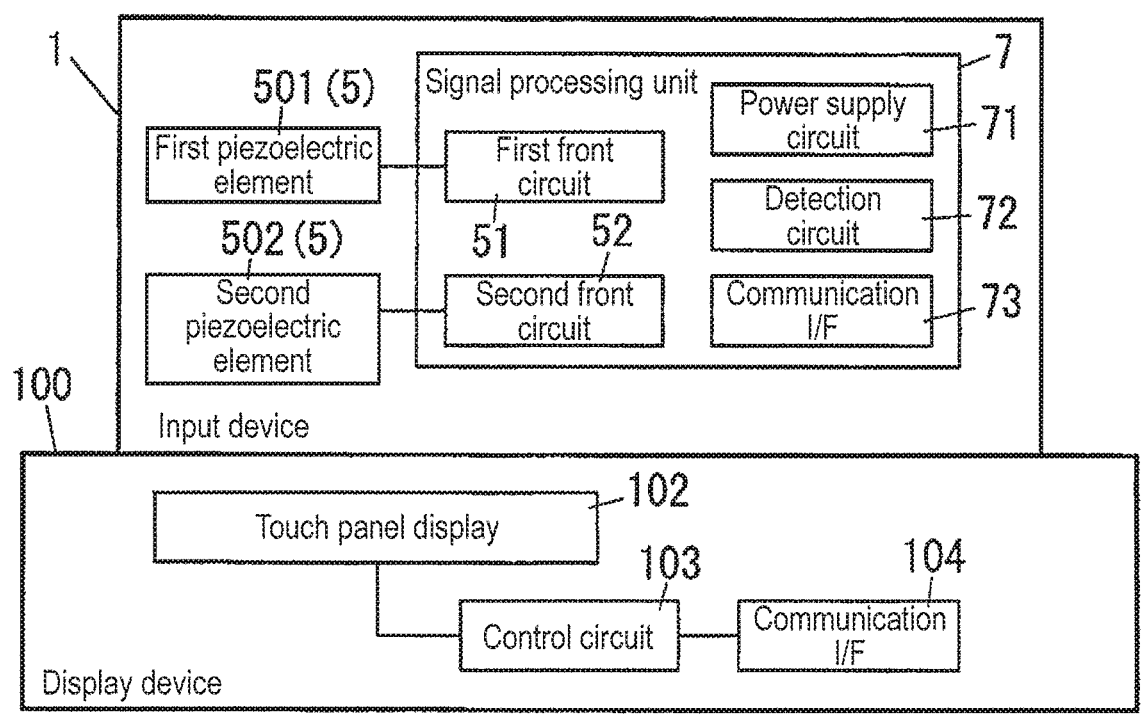
FIG. 6 is a block diagram of the input device in FIG. 1 and a display device.

A relationship between input device 1 and display device 100 will now be described with reference to FIG. 6. FIG. 6 is a block diagram of the input device in FIG. 1 and a display device. Display device 100 includes touch panel display 102. Display device 100 further includes input device 1. Therefore, display device 100 can be operated through both a touch operation and an operation with input device 1. In accordance with an entered content, display device 100 changes a content to be displayed on touch panel display 102, and also controls another device, for example.

Unless otherwise particularly specified, directions are described and expressed as "up", "down", "left", "right", "front", and "rear". An "up-down direction" refers to a direction orthogonal to attaching surface 101 when input device 1 is attached to display device 100. As to the up-down direction, a direction toward input device 1 when viewed from attaching surface 101 refers to upward. A "front-rear direction" refers to a longitudinal direction of attaching surface 101 when input device 1 is attached to display device 100. A "left-right direction" refers to a direction when input device 1 is attached to display device 100, and is viewed from front. In other words, the left-right direction is a direction orthogonal to the up-down direction.

In other words, the "up", "down", "left", "right", "front", and "rear" directions are defined as indicated by arrows in FIG. 1 and other figures. However, it should be noted that the directions are not intended to specify the direction of use of input device 1. Further, the arrows indicating the respective directions in the drawings are merely illustrated for description, and they are unsubstantial.

(2.1) Configuration

As illustrated in FIGS. 1 and 2, input device 1 includes housing 2, operation units 3, vibrating bodies 4, piezoelectric elements 5, pickers 6, signal processing unit 7, and attaching portion 8. As illustrated in FIGS. 3 to 4B, attaching portion 8 attaches housing 2 to attaching surface 101 of display device 100.

Housing 2 is made of a synthetic resin, for example. Housing 2 includes first case 21, second case 22, and third case 23. First case 21 and second case 22 each have a disc shape having flat surfaces facing the up-down direction. Third case 23 has a cylindrical shape that is open on both surfaces facing the up-down direction. Second case 22 and third case 23 are assembled from above into first case 21 in an order of second case 22 and third case 23. Therefore, second case 22 is disposed in a space surrounded by first case 21 and third case 23. First case 21 and second case 22 are coupled to each other with screws, for example. As illustrated in FIG. 2, third case 23 is coupled to first case 21 with four first screws 241. Housing 2 is configured as described above, and wholly has a hollow, flat circular column shape.

Housing 2 holds a plurality of (two in here) operation units 301, 302 that are respectively movable relative to housing 2. Operation unit 301 is an operation unit for rotation operation. Operation unit 302 is an operation unit for push operation. Operation unit 301 will be hereinafter referred to as "rotation operation unit 301", while operation unit 302 will be hereinafter referred to as "push operation unit 302".

As illustrated in FIG. 1, rotation operation unit 301 is held by housing 2 so as to be rotatable about rotation axis Z1 passing through rotation operation unit 301. Rotation axis Z1 is a virtual line passing through a center of rotation operation unit 301 and extending in the up-down direction. The term "rotation operation" used herein denotes an operation of rotating rotation operation unit 301 about rotation axis Z1. Push operation unit 302 is held by housing 2 so as to be movable straight along the up-down direction. The term "push operation" used herein denotes an operation of pushing push operation unit 302 downward.

Input device 1 includes click spring 31 having an annular shape in a planar view, as illustrated in FIG. 2. Click spring 31 is a plate spring for applying a counterforce (i.e., force sense) to an operator operating rotation operation unit 301. At both ends in the left-right direction of click spring 31, projections 311 projecting upward are formed.

Input device 1 further includes return spring 35 that causes, when a push operation is performed with push operation unit 302, push operation unit 302 to return to a position (reference position) at which push operation unit 302 has lied before the operation has been performed. Return spring 35 is a coil spring, for example. When a push operation is performed with push operation unit 302, return spring 35 is compressed to apply a force toward pushing push operation unit 302 upward to push operation unit 302.

Vibrating bodies 4, piezoelectric elements 5, and pickers 6, which are illustrated in FIG. 1, are respectively provided in correspondence to each of rotation operation unit 301 and push operation unit 302. One of vibrating bodies 4, one of piezoelectric elements 5, and some pickers 6, which correspond to rotation operation unit 301, will be hereinafter respectively referred to as "first vibrating body 401", "first piezoelectric element 501", and "first pickers 601". Another one of vibrating bodies 4, another one of piezoelectric elements 5, and one of pickers 6, which correspond to push operation unit 302, will be hereinafter respectively referred to as "second vibrating body 402", "second piezoelectric element 502", and "second picker 602".

However, when rotation operation unit 301 and push operation unit 302 are not particularly distinguished, both rotation operation unit 301 and push operation unit 302 will be hereinafter referred to as "operation units 3". Similarly, when first vibrating body 401 and second vibrating body 402 are not particularly distinguished, both first vibrating body 401 and second vibrating body 402 will be hereinafter referred to as "vibrating bodies 4". When first piezoelectric element 501 and second piezoelectric element 502 are not particularly distinguished, both first piezoelectric element 501 and second piezoelectric element 502 will be hereinafter referred to as "piezoelectric elements 5". When first pickers 601 and second picker 602 are not particularly distinguished, both first pickers 601 and second picker 602 will be hereinafter referred to as "pickers 6".

Vibrating bodies 4 and piezoelectric elements 5 are provided in a space surrounded by housing 2 and operation units 3. Vibrating bodies 4 each have a plate shape extending longer in a single direction. Vibrating bodies 4 are made of an elastic plate material. The elastic plate material is a metal plate made of stainless steel (SUS), for example.

As illustrated in FIG. 1, piezoelectric elements 5 are respectively attached to a side in a thickness direction of each of vibrating bodies 4. Thus, each of vibrating bodies 4 and each of piezoelectric elements 5 are integrally formed. Piezoelectric elements 5 are bonded to vibrating bodies 4, for example.

Vibrating bodies 4 each include the first end and the second end. The first end of each of vibrating bodies 4 is fixed to housing 2. On the other hand, the second end is not fixed to housing 2, and thus is vibratable. The first end of each of vibrating bodies 4 is indirectly fixed to housing 2 via first printed circuit board 701, for example. However, the first end of each of vibrating bodies 4 may be directly fixed to housing 2.

For example, when the second end of one of vibrating bodies 4 is flicked in the thickness direction of the one of vibrating bodies 4, the one of vibrating bodies 4 vibrates in the thickness direction of the one of vibrating bodies 4. When the one of vibrating bodies 4 vibrates in the thickness direction, the one of vibrating bodies 4 causes a corresponding one of piezoelectric elements 5 to warp. Therefore, the corresponding one of piezoelectric elements 5 generates power. In other words, the corresponding one of piezoelectric elements 5 converts vibration energy of the one of vibrating bodies 4 into electrical energy. Weight 41 may be provided to the second end of each of vibrating bodies 4. With this configuration, amplitude of vibration of each of vibrating bodies 4 can be increased.

One or more of pickers 6 and each of operation units 3 are integrated into a single member. In other words, first pickers 601 and rotation operation unit 301 are integrally provided, while second picker 602 and push operation unit 302 are integrally provided. Each of pickers 6 is provided so as to move together with a corresponding one of operation units 3 to flick the second end of a corresponding one of vibrating bodies 4 in the thickness direction of the corresponding one of vibrating bodies 4. As described above, a relative positional relationship between each of pickers 6 and each of vibrating bodies 4 is set.

When one of operation units 3 is operated, a corresponding one or more of pickers 6 flicks a corresponding one of vibrating bodies 4 to allow the corresponding one of vibrating bodies 4 to vibrate. When a rotation operation is performed with rotation operation unit 301, each of first pickers 601 causes first vibrating body 401 to vibrate, and thus first piezoelectric element 501 generates power. When a push operation is performed with push operation unit 302, second picker 602 causes second vibrating body 402 to vibrate, and thus second piezoelectric element 502 generates power.

A portion of each of vibrating bodies 4, at which each of pickers 6 comes into contact with and flicks, will be hereinafter referred to as "contactor 42". In the exemplary embodiment, each of contactors 42 lies on the second end of each of vibrating bodies 4.

Attaching portion 8 is a sucker. Attaching portion 8 is held by housing 2 so that an absorption surface of attached portion 8 is exposed from a lower surface of housing 2. Therefore, in input device 1, the lower surface of housing 2 is pushed against attaching surface 101. As described above, input device 1 is detachably attached to display device 100.

Input device 1 further includes slider 81, holding cam 82, holding bar 83, and a pair of holding springs 84, as illustrated in FIG. 2. The components configure a holding mechanism for holding attaching portion 8. Slider 81, holding cam 82, holding bar 83, and the pair of holding springs 84 are disposed between first case 21 and second case 22.

Projection 801 is provided at a center portion of an upper surface of attaching portion 8. Projection 801 projects upward. Projection 801 is provided with holding hole 802 passing in the front-rear direction. Holding bar 83 is inserted into holding hole 802. Both ends in the front-rear direction of holding bar 83 are held by holding cam 82. Holding cam 82 includes cam body 823 extending longer in the front-rear direction, a pair of bearing portions 821 each projecting downward from cam body 823, and a pair of cams 822 each projecting downward from cam body 823. The pair of cams 822 is provided at both ends in a longitudinal direction of cam body 823. The pair of bearing portions 821 lies between the pair of cams 822, and hold holding bar 83.

Slider 81 has a rectangular plate shape extending longer in the left-right direction in a planar view. At a center portion of slider 81, rectangular hole 811 passing in a thickness direction of slider 81 is provided. On an upper surface of slider 81, pairs of first recess 812 and second recess 813 each recessed downward are provided respectively adjacent to both sides in the front-rear direction of rectangular hole 811. In other words, first recess 812 and second recess 813 are provided in front of rectangular hole 811, while first recess 812 and second recess 813 are further provided in rear of rectangular hole 811.

Second recesses 813 are each recessed greater (deeper) than first recesses 812. Second recesses 813 are provided to right of first recesses 812 successively to first recesses 812. Therefore, on both sides on the upper surface of slider 81, and in front and rear of rectangular hole 811 in the front-rear direction, first recesses 812 and second recesses 813 are shaped in a stepwise manner.

Holding cam 82 is assembled from above into slider 81. The pair of bearing portions 821 is inserted from above into rectangular hole 811, while the pair of cams 822 lies on the both sides in the front-rear direction of slider 81. In other words, the both sides in the front-rear direction of slider 81, which lie adjacent to rectangular hole 811, are respectively inserted from below into respective gaps between bearing portions 821 and cams 822 in holding cam 82. The pair of holding springs 84 further applies forces toward holding cam 82 to push holding cam 82 downward. Therefore, holding cam 82 is pushed against the upper surface of slider 81.

Slider 81 illustrated in FIG. 4A is then held by housing 2 so as to be restricted from moving relative to housing 2 in the up-down direction and the front-rear direction. In other words, slider 81 is movable relative to housing 2 only in the left-right direction. On the other hand, holding cam 82 illustrated in FIG. 1 is held by housing 2 so as to be restricted from moving relative to housing 2 in the left-right direction and the front-rear direction. In other words, holding cam 82 is movable relative to housing 2 only in the up-down direction.

Therefore, when slider 81 moves relative to housing 2 in the left-right direction, holding cam 82 moves relative to housing 2 in the up-down direction. In other words, on the upper surface of slider 81 illustrated in FIG. 2, first recesses 812 and second recesses 813 are each shaped in the stepwise manner. Therefore, holding cam 82 changes its position in the up-down direction (hereinafter also referred to as "height") gradually as slider 81 moves in the left-right direction. When cam body 823 lies at left to first recess 812, holding cam 82 is highest. In an order of a position when cam body 823 lies in first recesses 812 and a position when cam body 823 lies in second recesses 813, holding cam 82 gradually lowers in height. Therefore, when slider 81 moves leftward relative to housing 2, holding cam 82 lowers in height gradually. When slider 81 moves rightward relative to housing 2, holding cam 82 rises in height gradually. When holding cam 82 changes in height, projection 801 held by holding cam 82 via holding bar 83 moves in the up-down direction.

With the holding mechanism configured as described above, a holding force applied by attaching portion 8 to display device 100 of input device 1 changes as slider 81 moves. The term "holding force" used herein denotes a force with which, while input device 1 is attached to display device 100, attaching portion 8 holds input device 1 to display device 100. The greater the holding force, the less the possibility of input device 1 of coming off display device 100. When attaching portion 8 is a sucker, an absorption force applied by attaching portion 8 to attaching surface 101 corresponds to the "holding force".

Figure 5A:
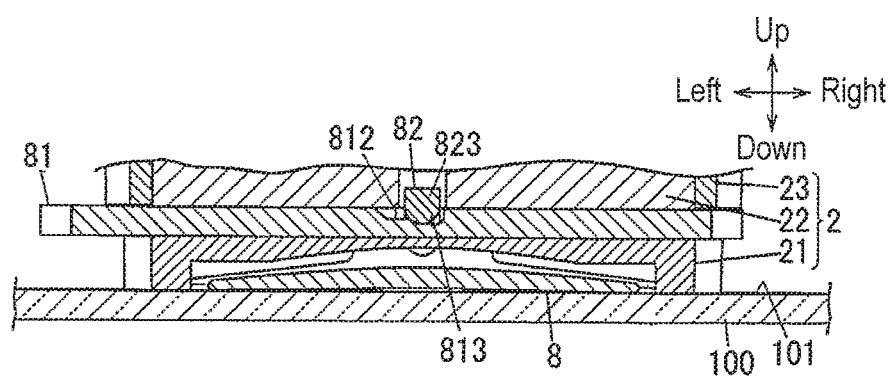
FIG. 5A is a cross-sectional view of the input device in FIG. 1 in a positioning state.
Figure 5B:
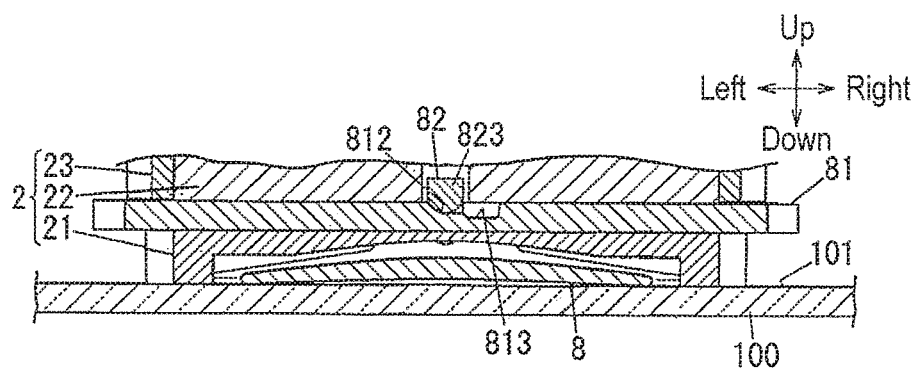
FIG. 5B is a cross-sectional view of the input device in FIG. 1 in a temporarily fixed state.
Figure 5C:
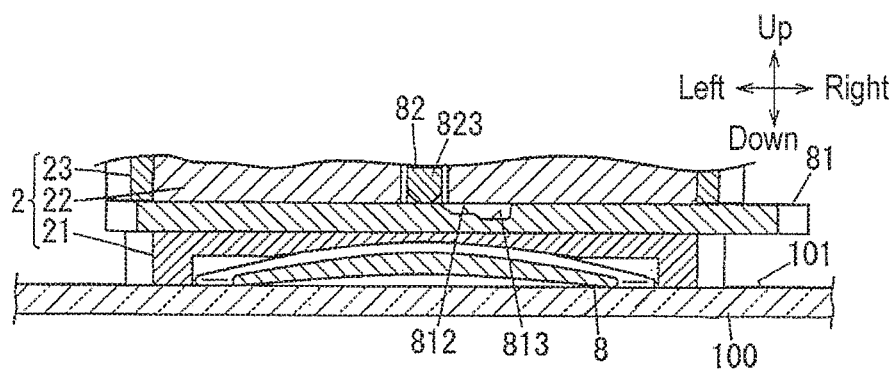
FIG. 5C is a cross-sectional view of the input device in FIG. 1 in a fully fixed state.

The holding mechanism will now be described with reference to FIGS. 1, and 5A to 5C. FIG. 5A is a cross-sectional view of the input device in FIG. 1 in a positioning state. FIG. 5B is a cross-sectional view of the input device in FIG. 1 in a temporarily fixed state. FIG. 5C is a cross-sectional view of the input device in FIG. 1 in a fully fixed state.

As illustrated in FIG. 5A, when slider 81 lies at a left end position of a movable range, cam body 823 lies in second recesses 813. Therefore, holding cam 82 lies at a lower end position of a movable range. At this time, attaching portion 8 (in particular, projection 801 illustrated in FIG. 1) lies at a lower end position of a movable range. A state illustrated in FIG. 5A is referred to as a "positioning state". Input device 1 is first attached in the positioning state to attaching surface 101 of display device 100.

As illustrated in FIG. 5B, when slider 81 lies at an intermediate position of the movable range, cam body 823 lies in first recesses 812. Therefore, holding cam 82 lies at an intermediate position of the movable range. In this case, attaching portion 8 (in particular, projection 801 illustrated in FIG. 1) lies at an intermediate position of the movable range. A state illustrated in FIG. 5B is referred to as a "temporarily fixed state". While being attached to attaching surface 101 of display device 100, input device 1 can be switched from the positioning state to the temporarily fixed state. Therefore, in attaching portion 8, projection 801 is lifted. Accordingly, a space between a lower surface of attaching portion 8 and attaching surface 101 expands. In other words, a degree of vacuum in the space between the lower surface of attaching portion 8 and attaching surface 101 increases. In other words, pressure lowers.

As illustrated in FIG. 5C, when slider 81 lies at a right end position of the movable range, cam body 823 lies at left to first recess 812. Therefore, holding cam 82 lies at an upper end position of the movable range. In this case, attaching portion 8 (in particular, projection 801 illustrated in FIG. 1) lies at an upper end position of the movable range. A state illustrated in FIG. 5C is referred to as a "fully fixed state". While being attached to attaching surface 101 of display device 100, input device 1 can be switched from the temporarily fixed state to the fully fixed state. Therefore, in attaching portion 8, projection 801 is further lifted. Accordingly, the space between the lower surface of attaching portion 8 and attaching surface 101 expands. In other words, the degree of vacuum in the space between the lower surface of attaching portion 8 and attaching surface 101 further increases. In other words, the pressure further lowers.

When an operator attaches input device 1 to display device 100, the operator first puts input device 1 in the positioning state on attaching surface 101 of display device 100. The operator then moves slider 81 rightward to switch input device 1 in state in an order of the temporarily fixed state and the fully fixed state. As a result, a degree of vacuum in the space between the lower surface of attaching portion 8 and attaching surface 101 increases gradually, and accordingly input device 1 is securely attached to display device 100. When the operator removes input device 1 from display device 100, the operator moves slider 81 leftward to switch input device 1 in state in an order of the fully fixed state, the temporarily fixed state, and the positioning state. As a result, the degree of vacuum in the space between the lower surface of attaching portion 8 and attaching surface 101 lowers gradually, and accordingly input device 1 can be easily removed from display device 100.

As illustrated in FIG. 2, signal processing unit 7 includes first printed circuit board 701 and electronic parts including integrated circuit (IC) 704. In addition to IC 704, signal processing unit 7 further includes other electronic parts, such as capacitors. Among the electronic parts, IC 704 is at least installed on first printed circuit board 701. In addition to first printed circuit board 701, input device 1 further includes second printed circuit board 702 and third printed circuit board 703. Second printed circuit board 702 is mechanically coupled to first vibrating body 401. Third printed circuit board 703 is mechanically coupled to second vibrating body 402. Second printed circuit board 702 and third printed circuit board 703 are electrically coupled to first printed circuit board 701. The electronic parts configuring signal processing unit 7 are separately installed on first printed circuit board 701, second printed circuit board 702, and third printed circuit board 703.

Signal processing unit 7 will now be described with reference to FIG. 6. FIG. 6 is a block diagram of the input device in FIG. 1 and the display device. Signal processing unit 7 includes power supply circuit 71, detection circuit 72, and communication interface 73. The term "interface" will be hereinafter referred to as "I/F". Signal processing unit 7 further includes first front circuit 51 and second front circuit 52. First front circuit 51 is electrically coupled to first piezoelectric element 501. Second front circuit 52 is electrically coupled to second piezoelectric element 502. First front circuit 51 and second front circuit 52 will be described later in detail in "(2.3) Signal processing unit".

Power supply circuit 71 includes capacitors. Power supply circuit 71 is configured to store in each of the capacitors electric charge generated by each of piezoelectric elements 5. Power supply circuit 71 is electrically coupled with piezoelectric elements 5 via first front circuit 51 and second front circuit 52. Power supply circuit 71 is configured to generate power for operating signal processing unit 7.

Detection circuit 72 is configured to generate detection information based on an electrical signal output from each of piezoelectric elements 5. In other words, piezoelectric elements 5 are each configured to output an electrical signal as a corresponding one of vibrating bodies 4 vibrates. Based on the electrical signal, detection circuit 72 generates detection information. Detection circuit 72 is configured to accept an electrical signal entered by each of piezoelectric elements 5 via first front circuit 51 and second front circuit 52. Detection circuit 72 is configured to use a direct current voltage acquired by rectifying and smoothing an electrical signal to generate a pulse signal indicative of detection information. For example, when a direct current voltage acquired by rectifying and smoothing an electrical signal reaches a predetermined threshold value, detection circuit 72 outputs a pulse signal. In other words, detection circuit 72 does not use an electrical signal output from each of piezoelectric elements 5 as is, but waveform-shapes the electrical signal into a pulse signal indicative of detection information.

Detection circuit 72 at least distinguishes an electrical signal from first piezoelectric element 501 and an electrical signal from second piezoelectric element 502, which are entered, via separate terminals, to signal processing unit 7, for example, to generate detection information. Therefore, with detection information, which of rotation operation unit 301 and push operation unit 302 is operated can be identified.

Communication I/F 73 is configured to transmit detection information generated by detection circuit 72 to display device 100 through wireless communications of radio waves used as a medium. Specifically, upon receiving a pulse signal from detection circuit 72, communication I/F 73 modulates a carrier wave in accordance with detection information to transmit the detection information through wireless communications. Communication I/F 73 follows a communication method, such as WiFi (registered trademark), Bluetooth (registered trademark), and specified small power radio. The specified small power radio requires neither certification nor registration.

In addition to touch panel display 102, display device 100 is provided with control circuit 103 and communication I/F 104. Communication I/F 104 is configured to perform wireless communications with communication I/F 73. Therefore, display device 100 fetches detection information from input device 1 through wireless communications. In accordance with the fetched detection information, control circuit 103 controls touch panel display 102, for example.

A detailed configuration of input device 1 will now further be described.

As illustrated in FIGS. 1 and 2, a center portion of first case 21 is formed with first hole 211 passing through first case 21 in the up-down direction. First hole 211 opens in a circular shape on the lower surface of housing 2. On an upper surface of first case 21, first groove 212 is formed across both ends in the left-right direction of first case 21. First groove 212 is formed in such a manner that the upper surface of first case 21 is recessed downward at the center portion in the front-rear direction. Slider 81 is then disposed in first groove 212. Therefore, when second case 22 is overlapped on first case 21, slider 81 is restricted from moving in the up-down direction and the front-rear direction.

First case 21 is further formed with a pair of positioning holes 213 each passing in the up-down direction. The pair of positioning holes 213 is respectively formed at the center portion in the left-right direction of first case 21, and on both sides in the front-rear direction of first hole 211. The pair of cams 822 is inserted into the pair of positioning holes 213. Therefore, holding cam 82 is restricted from moving in the left-right direction and the front-rear direction.

As illustrated in FIG. 1, a lower surface of first case 21 is formed with first recess 214 opening in a circular shape. When input device 1 is attached to display device 100, first recess 214 forms a space for accommodating attaching portion 8 between first case 21 and attaching surface 101. A bottom surface of first recess 214 is formed in a tapered shape in which first recess 214 deepens toward first hole 211. With projection 801 projecting upward, via first hole 211, above the upper surface of first case 21, and with projection 801 being coupled to holding cam 82 with holding bar 83, attaching portion 8 is held by first case 21.

An upper surface of second case 22 is formed with guide rib 221 projecting upward. Guide rib 221 has an annular shape, and lies along an outer circumference on the upper surface of second case 22. A region surrounded by guide rib 221 on the upper surface of second case 22 is formed with second recess 222. Second vibrating body 402, second piezoelectric element 502, and third printed circuit board 703 are accommodated in second recess 222. Further, first printed circuit board 701 is accommodated in a space surrounded by guide rib 221. First printed circuit board 701 is disposed so as to cover second recess 222, and fixed to second case 22 with screws 242 (see FIG. 2). Both sides in the front-rear direction of second recess 222 on the upper surface of second case 22 illustrated in FIG. 2 are formed with caulking portions 225 used to caulk click spring 31. In other words, click spring 31 is attached in the region surrounded by guide rib 221 on the upper surface of second case 22.

A lower surface of second case 22 illustrated in FIG. 1 is formed with second groove 223 extending longer in the front-rear direction. Second groove 223 is formed in such a manner that the lower surface of second case 22 is recessed upward at a center portion in the left-right direction. Holding cam 82 is then disposed in second groove 223. Further, both ends in the front-rear direction of second groove 223 are respectively coupled to a pair of spring accommodation grooves extending longer in the left-right direction. In other words, the lower surface of second case 22 is formed with an H-shaped groove in which the pair of spring accommodation grooves is coupled by second groove 223. The pair of holding springs 84 (see FIG. 2) is accommodated in the pair of spring accommodation grooves. The center portion of second case 22 is formed with second hole 224 (see FIG. 2) passing in the up-down direction. Second groove 223 and second recess 222 are in communication with each other with second hole 224.

Around opening 231 on the upper surface of third case 23, extended portion 232 extending inward is formed. Opening 231 opens in a circular shape on an upper surface of housing 2. A lower surface of third case 23 is formed with third recesses 233 illustrated in FIG. 2. Third recesses 233 are formed in such a manner that the lower surface of third case 23 is recessed upward at a center portion in the front-rear direction. Together with first groove 212, third recesses 233 form a slide hole opening toward both sides in the left-right direction of housing 2. Slider 81 is disposed in the slide hole.

Figure 7A:
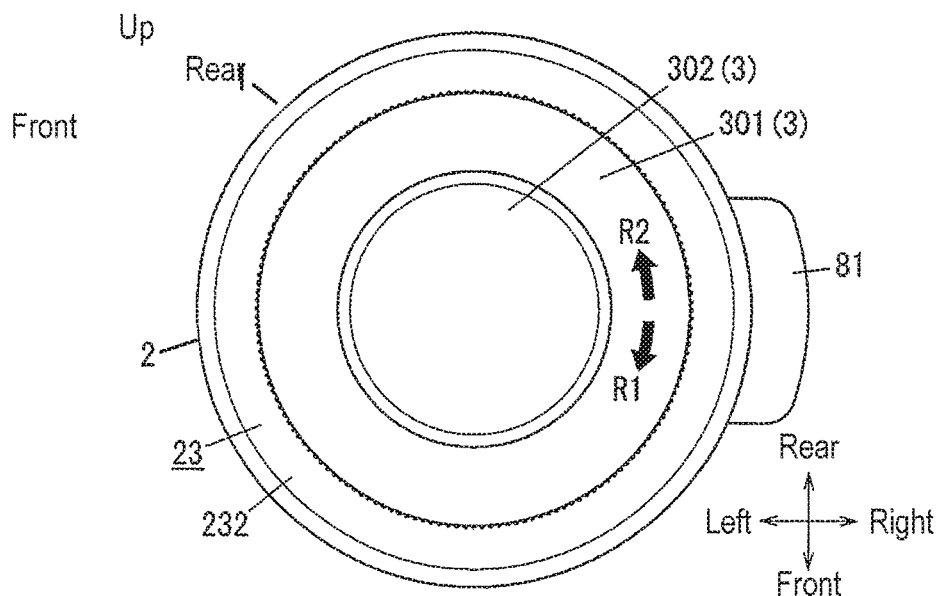
FIG. 7A is a top view of the input device in FIG. 1
Figure 7B:
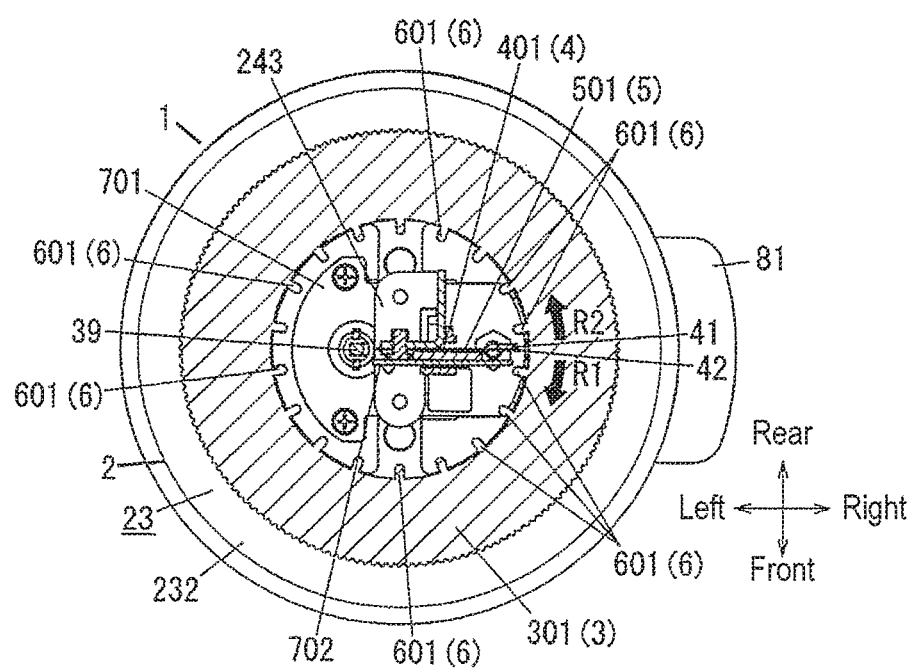
FIG. 7B is a cross-sectional view taken along line 7B-7B shown in FIG. 4A.

Next, rotation operation unit 301 will now be described with reference to FIGS. 1, 2, 7A, and 7B. FIG. 7A is a top view of the input device in FIG. 1. FIG. 7B is a cross-sectional view taken along lone 7B-7B in FIG. 4A.

Rotation operation unit 301 illustrated in FIG. 1 has a circular column shape centered about rotation axis Z1. Rotation operation unit 301 is made of a synthetic resin, for example. An upper surface of rotation operation unit 301 is formed with upper side recess 32 opening in a circular shape. Push operation unit 302 and return spring 35 are accommodated in upper side recess 32. A center portion on a bottom surface of upper side recess 32 is formed with through hole 33 opening in a circular shape. Through hole 33 passes through rotation operation unit 301 in the up-down direction. A lower end on an outer circumferential surface of rotation operation unit 301 is formed with flange portion 34 projecting in a diameter direction of rotation operation unit 301 over a whole circumference of rotation operation unit 301.

As illustrated in FIG. 1, a lower surface of rotation operation unit 301 is formed with lower side recess 36 opening in a circular shape. An outer diameter of rotation operation unit 301, excluding flange portion 34, is rather smaller than an inner diameter of opening 231. An outer diameter of flange portion 34 is rather greater than the inner diameter of opening 231. An inner diameter of lower side recess 36 is equal to or greater than an outer diameter of guide rib 221. With the dimensional relationship described above, rotation operation unit 301 is assembled in housing 2 so as to pass through opening 231, and to project upward above the upper surface of housing 2. In this state, flange portion 34 is accommodated between the upper surface of second case 22 and a lower surface of extended portion 232. Therefore, flange portion 34 catches extended portion 232, preventing rotation operation unit 301 from coming off housing 2. Further, lower side recess 36 is inserted with guide rib 221. Guide rib 221 guides rotation operation unit 301 so as to be rotatable about rotation axis Z1. On the outer circumferential surface of rotation operation unit 301, a plurality of anti-slip grooves each extending longer in the up-down direction are formed over the whole circumference of rotation operation unit 301.

To distinguish a direction of rotation when a rotation operation is performed with rotation operation unit 301, a clockwise rotation in a planar view, that is, a rotation in a direction indicated by arrow R1 in FIGS. 7A and 7B, will be hereinafter referred to as a "normal rotation". On the other hand, a counterclockwise rotation in the planar view, that is, a rotation in a direction indicated by arrow R2 in FIGS. 7A and 7B, will be hereinafter referred to as a "reverse rotation".

As illustrated in FIG. 1, a bottom surface of lower side recess 36 is formed with click rib 37 projecting downward. Click rib 37 is a rib having an annular shape along an outer circumference of the bottom surface of lower side recess 36. Although not shown in the figures, a lower surface of click rib 37 is alternately formed with a plurality of recesses and a plurality of projections in a circumferential direction of click rib 37. Although not shown in the figures, the recesses and the projections are provided over a whole circumference of click rib 37. The lower surface of click rib 37 abuts an upper surface of click spring 31 (see FIG. 2). Projections 311 of click spring 31 come into contact with the lower surface of click rib 37. Therefore, each time rotation operation unit 301 rotates by a predetermined rotation angle, the projections on the lower surface of click rib 37 elastically deform and pass over projections 311, providing a click feel (an operational feeling) to an operator of rotation operation unit 301. In other words, click spring 31 and click rib 37 configure a click mechanism configured to provide a click feel to an operator when the operator performs a rotation operation with rotation operation unit 301.

In a region surrounded by click rib 37, an amount of recess on lower side recess 36, that is, a depth of lower side recess 36, is greater (deeper) than an amount of recess, that is, a depth, in a region outside click rib 37. First vibrating body 401, first piezoelectric element 501, and second printed circuit board 702 (see FIG. 2) are accommodated in a space surrounded by click rib 37 in an interior space of lower side recess 36.

First vibrating body 401 is fixed, together with second printed circuit board 702, to first printed circuit board 701 via stay 243. Stay 243 illustrated in FIG. 2 is fixed to an upper surface of first printed circuit board 701 with screws 244. First vibrating body 401 and second printed circuit board 702 are fixed to stay 243 with screw 245. With stay 243, a longitudinal direction of first vibrating body 401 and the left-right direction align with each other. Stay 243 holds first vibrating body 401 in a direction toward which a thickness direction of first vibrating body 401 and the front-rear direction align with each other. A left end of first vibrating body 401 is fixed to stay 243. Therefore, the left end of first vibrating body 401 illustrated in FIG. 1 is regarded as a first end of first vibrating body 401, while a right end of first vibrating body 401 is regarded as a second end (contactor 42) of first vibrating body 401.

An inner circumferential surface of click rib 37 is formed with first pickers 601 projecting toward rotation axis Z1. In other words, first pickers 601 are provided to rotation operation unit 301. First pickers 601 are ribs each extending longer in the up-down direction. A plurality of first pickers 601 are formed at even intervals (equal pitches) in a circumferential direction of click rib 37. Therefore, as rotation operation unit 301 rotates, the plurality of first pickers 601 move in the circumferential direction of click rib 37. As rotation operation unit 301 rotates, each of first pickers 601 flicks first vibrating body 401. A rotation angle of rotation operation unit 301 when first pickers 601 move by an amount of interval between adjacent two first pickers 601 (one pitch) will be hereinafter referred to as a "minimum rotation angle".

As illustrated in FIG. 7B, the second end (right end in here), that is, contactor 42, of first vibrating body 401 lies between adjacent two first pickers 601. In other words, two first pickers 601 lie on both sides in the front-rear direction of contactor 42 of first vibrating body 401. With the above described positional relationship between first vibrating body 401 and first pickers 601, as rotation operation unit 301 rotates, each of first pickers 601 comes into contact with first vibrating body 401, and bends first vibrating body 401. Therefore, as rotation operation unit 301 rotates, each of first pickers 601 flicks first vibrating body 401.

Next, push operation unit 302 will now be described. Push operation unit 302 illustrated in FIG. 1 has a disc shape centered about rotation axis Z1. Push operation unit 302 is made of a synthetic resin, for example. A lower surface of push operation unit 302 is formed with circumferential groove 38 recessed upward. Circumferential groove 38 has an annular shape along an outer circumference of the lower surface of push operation unit 302. Return spring 35 is at least partially accommodated in circumferential groove 38. A region surrounded by circumferential groove 38 on the lower surface of push operation unit 302 is formed with projection 39 projecting downward. Push operation unit 302 is assembled with rotation operation unit 301 so as to be accommodated in upper side recess 32. Projection 39 projects downward, via through hole 33, below the bottom surface of lower side recess 36. In this state, projection 39 partially catches rotation operation unit 301, preventing push operation unit 302 from coming off rotation operation unit 301. Projection 39 abuts stay 243, restricting push operation unit 302 from rotating. Therefore, push operation unit 302 is movable relative to housing 2 straight along the up-down direction.

Together with third printed circuit board 703, second vibrating body 402 is disposed below first printed circuit board 701. Second vibrating body 402 and third printed circuit board 703 are fixed to first printed circuit board 701 with screw 246 and nut 247. Spacer 248 is attached between a lower surface of first printed circuit board 701 and second vibrating body 402 so that first printed circuit board 701 does not prevent second vibrating body 402 from vibrating. With first printed circuit board 701, a longitudinal direction of second vibrating body 402 and the left-right direction align with each other. First printed circuit board 701 holds second vibrating body 402 in a direction toward which a thickness direction of second vibrating body 402 and the up-down direction align with each other. A right end of second vibrating body 402 is fixed to first printed circuit board 701. Therefore, the right end of second vibrating body 402 is regarded as an end on a first end of second vibrating body 402, while a left end of second vibrating body 402 is regarded as an end (contactor 42) on a second end of second vibrating body 402.

Projection 39 partially projects downward, via transparent hole 705 of first printed circuit board 701 (see FIG. 2), below the lower surface of first printed circuit board 701. An end of projection 39, which projects downward below first printed circuit board 701 is formed with second picker 602 projecting rightward. Therefore, as push operation unit 302 moves in the up-down direction, second picker 602 also moves in the up-down direction. As push operation unit 302 moves, second picker 602 flicks second vibrating body 402.

As illustrated in FIG. 1, when no push operation is performed with push operation unit 302, the end (left end in here), that is, contactor 42, on the second end of second vibrating body 402 lies under second picker 602. In other words, second picker 602 lies above contactor 42 of second vibrating body 402. With the above described positional relationship between second vibrating body 402 and second picker 602, when a push operation is performed with push operation unit 302, second picker 602 comes into contact with second vibrating body 402, and bends second vibrating body 402. Therefore, when a push operation is performed with push operation unit 302, second picker 602 flicks second vibrating body 402.

(2.2) Operation

An operation of input device 1 will now be described. How input device 1 operates when a rotation operation is performed with rotation operation unit 301 will now first be described.

When rotation operation unit 301 normal-rotates by the minimum rotation angle from the state illustrated in FIG. 7B, one of first pickers 601 lying at rear of contactor 42 moves toward front of contactor 42. At this time, the one of first pickers 601 comes into contact with contactor 42, and bends forward first vibrating body 401. Therefore, when the one of first pickers 601 passes over contactor 42, vibrating body 401 is flicked in the thickness direction. When rotation operation unit 301 reverse-rotates by the minimum rotation angle from the state illustrated in FIG. 7B, one of first pickers 601 at front of contactor 42 moves toward rear of contactor 42. At this time, the one of first pickers 601 comes into contact with contactor 42, and bends backward first vibrating body 401. Therefore, when the one of first pickers 601 passes over contactor 42, first vibrating body 401 is flicked in the thickness direction.

In other words, a moving direction of rotation operation unit 301 and a moving direction of first pickers 601 correspond to and match each other. When first pickers 601 move between a first position and a second position, a part (contactor 42) of first vibrating body 401 lies on an orbital path of first pickers 601. As for first pickers 601, the "first position" refers to a position at rear of contactor 42, while the "second position" refers to a position at front of contactor 42. In other words, in both of a case when first pickers 601 move from the first position to the second position, and a case when first pickers 601 move from the second position to the first position, first pickers 601 each flick first vibrating body 401.

When first vibrating body 401 is flicked, first vibrating body 401 vibrates in the thickness direction. Vibration energy of first vibrating body 401 is thus converted into electrical energy by first piezoelectric element 501. As a result, signal processing unit 7 (see FIG. 6) receives power generated by first piezoelectric element 501 to operate. Signal processing unit 7 generates detection information based on an electrical signal output from first piezoelectric element 501. Signal processing unit 7 then transmits the detection information generated as rotation operation unit 301 moves to display device 100 through wireless communications.

As to the plurality of projections formed on the lower surface of click rib 37 illustrated in FIG. 1 and the plurality of first pickers 601, positions and intervals in the circumferential direction of click rib 37 are respectively identical to each other. In other words, the plurality of projections formed on the lower surface of click rib 37 and the plurality of first pickers 601 are disposed in a diameter direction of click rib 37. Further, first vibrating body 401 is disposed on a straight line connecting a pair of projections 311 of click spring 31 (see FIG. 2). Therefore, when contactor 42 of first vibrating body 401 lies at an approximately center between a pair of first pickers 601 adjacent to each other, projections 311 of click spring 31 come into contact with the recesses on the lower surface of click rib 37. On the other hand, when one of first pickers 601 comes into contact with contactor 42 of first vibrating body 401, projections 311 of click spring 31 come into contact with the projections on the lower surface of click rib 37.

In other words, when rotation operation unit 301 is not applied with predetermined rotation torque, in a state of which is referred to as a non-operation state, projections 311 of click spring 31 fit into the recesses on the lower surface of click rib 37. Therefore, a rotation position of rotation operation unit 301 is kept stable. Each time rotation operation unit 301 rotates by the minimum rotation angle, each of first pickers 601 flicks first vibrating body 401. In addition, the click mechanism provides a click feel to an operator. In other words, when a rotation operation is performed with rotation operation unit 301, each of first pickers 601 flicks first vibrating body 401 in synchronization with a click feel.

Next, how input device 1 operates when a push operation is performed with push operation unit 302 will now be described.

When push operation unit 302 illustrated in FIG. 1 is pushed downward, second picker 602 lying above contactor 42 lowers below contactor 42. At this time, second picker 602 comes into contact with contactor 42 to bend downward second vibrating body 402. Therefore, when second picker 602 passes over contactor 42, vibrating body 402 is flicked in the thickness direction. From this state, when the push operation performed by an operator with push operation unit 302 is cancelled (the operator releases his or her hand or finger from push operation unit 302), second picker 602 lying below contactor 42 rises above contactor 42. At this time, second picker 602 comes into contact with contactor 42 to bend upward second vibrating body 402. Therefore, when second picker 602 passes over contactor 42, second vibrating body 402 is flicked in the thickness direction.

In other words, a moving direction of push operation unit 302 and a moving direction of second picker 602 correspond to and match each other. When second picker 602 moves between a first position and a second position, a part (contactor 42) of second vibrating body 402 lies on an orbital path of second picker 602. As for second picker 602, the "first position" refers to a position above contactor 42, while the "second position" refers to a position below contactor 42. In other words, in both of a case when second picker 602 moves from the first position to the second position, and a case when second picker 602 moves from the second position to the first position, second picker 602 flicks second vibrating body 402.

When second vibrating body 402 is flicked, second vibrating body 402 vibrates in the thickness direction. Vibration energy of second vibrating body 402 is thus converted into electrical energy by second piezoelectric element 502. As a result, signal processing unit 7 receives power generated by second piezoelectric element 502 to operate. Signal processing unit 7 generates detection information based on an electrical signal output from second piezoelectric element 502. Signal processing unit 7 then transmits the detection information generated as push operation unit 302 moves to display device 100 through wireless communications.

(2.3) Signal Processing Unit

Figure 8:
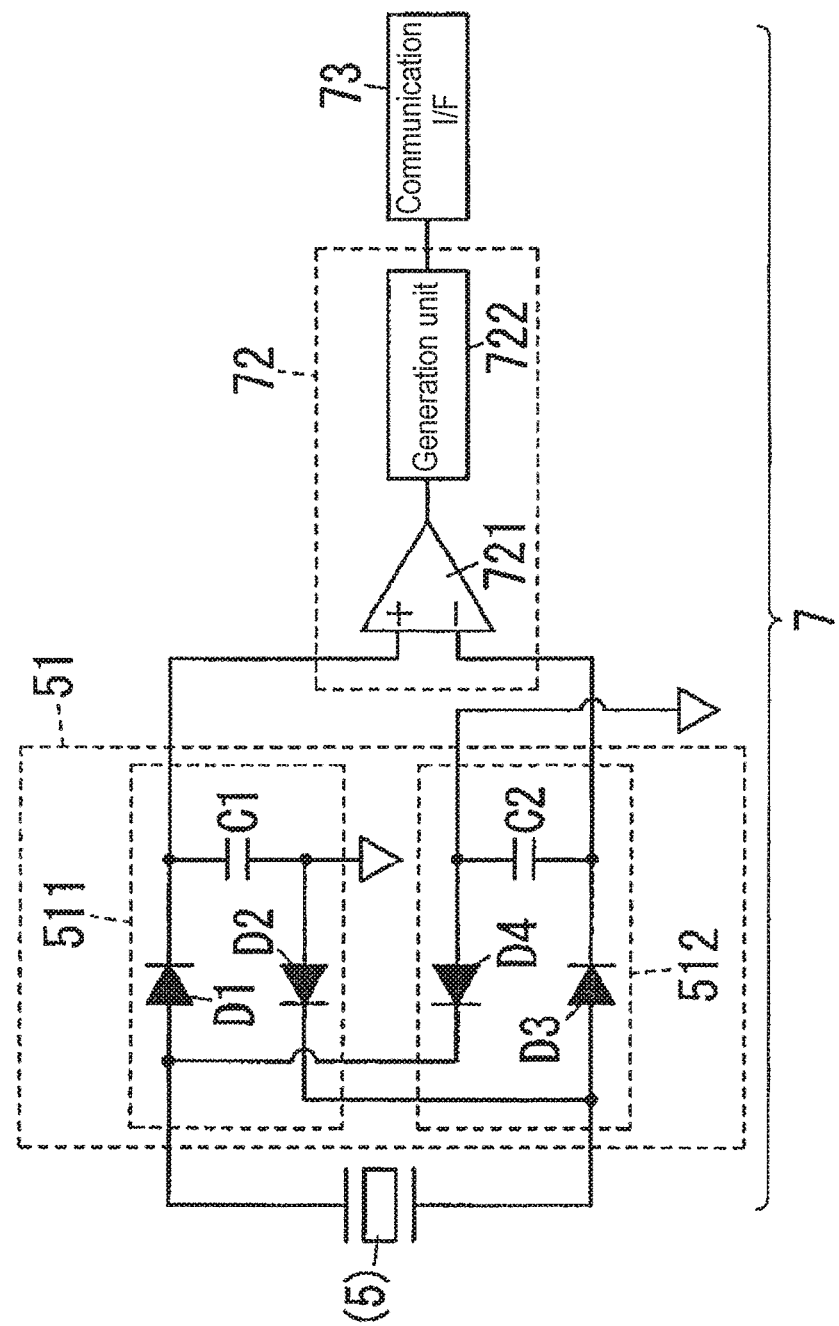
FIG. 8 is a circuit diagram of a signal processing unit of the input device in FIG. 1.
Figure 9A:
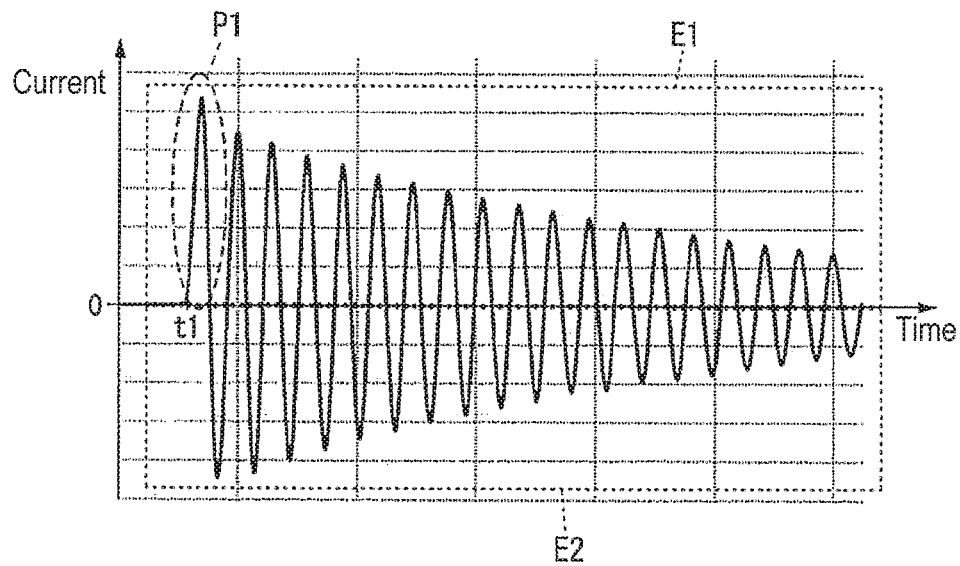
FIG. 9A is a graph of an example electrical signal of the input device in FIG. 1.
Figure 9B:
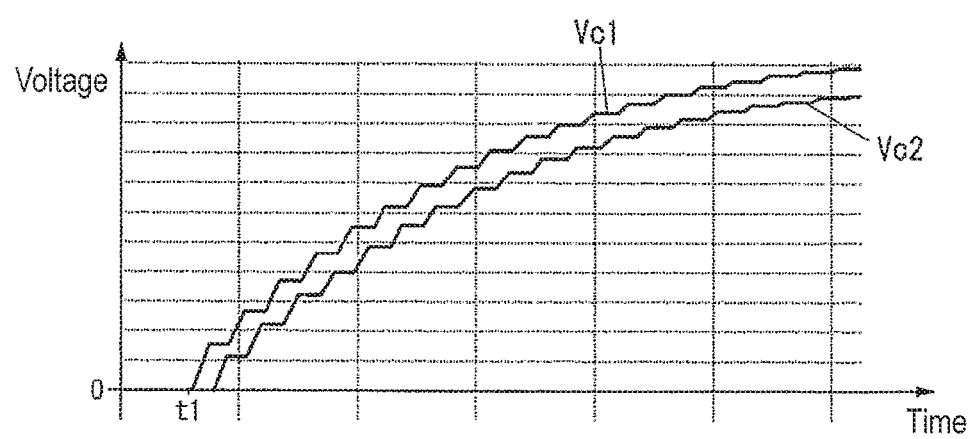
FIG. 9B is a graph of an example output voltage of a front circuit of the input device in FIG. 1.

How signal processing unit 7 is configured and operated will now be described in further detail with reference to FIGS. 8, 9A, and 9B. FIG. 8 is a circuit diagram of a signal processing unit of the input device in FIG. 1. FIG. 9A is a graph of an example electrical signal of the input device in FIG. 1. FIG. 9B is a graph of an example output voltage of a front circuit of the input device in FIG. 1.

In the exemplary embodiment, each of piezoelectric elements 5 outputs different electrical signals between a case when one of pickers 6 moves from the first position to the second position, and the one of pickers 6 flicks a corresponding one of vibrating bodies 4, and a case when one of pickers 6 moves from the second position to the first position, and the one of pickers 6 flicks a corresponding one of vibrating bodies 4. Signal processing unit 7 then detects with detection circuit 72 a moving direction of each of operation units 3 based on an electrical signal, and adds a result of detection performed by detection circuit 72 to the detection information, and transmits the detection information. In here, detection circuit 72 compares magnitudes of amplitude between a first component with positive polarity and a second component with negative polarity in an electrical signal, and detects, based on a result of comparison on the magnitudes of amplitude, a moving direction of each of operation units 3. How signal processing unit 7 is specifically configured to detect a moving direction of each of operation units 3 will now be described. Signal processing unit 7 is electrically coupled with two piezoelectric elements 5, that is, first piezoelectric element 501 and second piezoelectric element 502. However, first piezoelectric element 501 will be focused on and described below. The below description can be applied to second piezoelectric element 502 when "first front circuit 51" is replaced with "second front circuit 52".

First front circuit 51 includes positive electrode side extraction unit 511 and negative electrode side extraction unit 512. Positive electrode side extraction unit 511 includes a series circuit of diode D1, positive electrode side capacitor C1, and diode D2. Positive electrode side capacitor C1 is charged when a voltage is applied to positive electrode side extraction unit 511 via an anode of diode D1, which is regarded as a positive electrode, and a cathode of diode D2, which is regarded as a negative electrode. Negative electrode side extraction unit 512 includes a series circuit of diode D3, negative electrode side capacitor C2, and diode D4. Negative electrode side capacitor C2 is charged when a voltage is applied to negative electrode side extraction unit 512 via an anode of diode D3, which is regarded as a positive electrode, and a cathode of diode D4, which is regarded as a negative electrode.

Positive electrode side extraction unit 511 and negative electrode side extraction unit 512 are coupled in antiparallel between both ends of each of piezoelectric elements 5. In other words, one of the ends of each of piezoelectric elements 5 (hereinafter referred to as "positive electrode") is coupled with the anode of diode D1 in positive electrode side extraction unit 511 and the cathode of diode D4 in negative electrode side extraction unit 512. The other one of the ends of each of piezoelectric elements 5 (hereinafter referred to as "negative electrode") is coupled with the cathode of diode D2 in positive electrode side extraction unit 511 and the anode of diode D3 in negative electrode side extraction unit 512. Therefore, positive electrode side capacitor C1 is charged by a current component flowing from the positive electrode of each of piezoelectric elements 5 into signal processing unit 7, that is, a first component of an electrical signal. On the other hand, negative electrode side capacitor C2 is charged with a current component flowing from the negative electrode of each of piezoelectric elements 5 into signal processing unit 7, that is, a second component of the electrical signal.

Detection circuit 72 includes comparator 721 and generation unit 722. Comparator 721 is configured to compare an end-to-end voltage of positive electrode side capacitor C1 with an end-to-end voltage of negative electrode side capacitor C2. In other words, detection circuit 72 is configured to compare magnitudes of amplitude between a first component with positive polarity and a second component with negative polarity in an electrical signal. Generation unit 722 is coupled to an output of comparator 721, and is configured to generate detection information based on a result of comparison performed by comparator 721.

FIG. 9A illustrates an electrical signal (current signal) output from each of piezoelectric elements 5 when a corresponding one of vibrating bodies 4 vibrates. In FIGS. 9A and 9B, "t1" represents a time when the corresponding one of vibrating bodies 4 is flicked. In FIG. 9A, a horizontal axis shows time, while a vertical axis shows current output from each of piezoelectric elements 5. As described above, an electrical signal output from each of piezoelectric elements 5 is an alternating current signal that vibrates with respect to zero in here. In FIG. 9A, a region corresponding to first component E1 with positive polarity is indicated as "E1", while a region corresponding to second component E2 with negative polarity is indicated as "E2".

In here, an electrical signal corresponds to vibration of vibrating body 4. The electrical signal thus gradually attenuates in amplitude as time passes by. Therefore, amplitude is unbalanced between first component E1 and second component E2 in an electrical signal. A size relationship in amplitude between first component E1 and second component E2 is determined according to whether a first pulse in an electrical signal (hereinafter referred to as "first pulse P1") belongs to first component E1 or second component E2. FIG. 9A exemplifies that a pulse component indicated as "P1" represents first pulse P1. In other words, between first component E1 and second component E2, a component to which first pulse P1 belongs is greater in amplitude. Therefore, as illustrated in FIG. 9A, when first component E1 contains first pulse P1, first component E1 is greater in amplitude than second component E2. Whether first pulse P1 belongs to first component E1 or second component E2 is determined by a direction toward which each of pickers 6 flicks a corresponding one of vibrating bodies 4. It is assumed that, when one of pickers 6 moves from the first position to the second position, and flicks a corresponding one of vibrating bodies 4, first pulse P1 belongs to first component E1.

FIG. 9B illustrates end-to-end voltage Vc1 of positive electrode side capacitor C1 and end-to-end voltage Vc2 of negative electrode side capacitor C2 when an electrical signal illustrated in FIG. 9A is generated. In FIG. 9B, a horizontal axis shows time, while a vertical axis shows voltage. End-to-end voltage Vc1 of positive electrode side capacitor C1 corresponds to an integrated value of amplitude of first component E1. End-to-end voltage Vc2 of negative electrode side capacitor C2 corresponds to an integrated value of amplitude of second component E2. Therefore, when first component E1 contains first pulse P1, as illustrated in FIG. 9B, end-to-end voltage Vc1 of positive electrode side capacitor C1 is greater than end-to-end voltage Vc2 of negative electrode side capacitor C2.

Therefore, a direction toward which one of pickers 6 has flicked a corresponding one of vibrating bodies 4 can be identified from a result of comparison between end-to-end voltage Vc1 of positive electrode side capacitor C1 and end-to-end voltage Vc2 of negative electrode side capacitor C2. Generation unit 722 illustrated in FIG. 8 is configured to generate detection information based on a result of comparison performed by comparator 721. In other words, generation unit 722 is configured to generate detection information including a moving direction of one of operation units 3 (a result of detection performed by detection circuit 72). In other words, detection information transmitted from signal processing unit 7 contains a moving direction of one of operation units 3.

Since power for operating signal processing unit 7 is generated by power supply circuit 71 (see FIG. 6) using an output of each of piezoelectric elements 5, signal processing unit 7 may not yet be started at time t1 at which one of vibrating bodies 4 has been flicked. In this case, after signal processing unit 7 is started, detection circuit 72 detects a direction toward which one of pickers 6 flicks a corresponding one of vibrating bodies 4, that is, a moving direction of one of operation units 3.

Upon detecting a direction toward which one of pickers 6 has flicked a corresponding one of vibrating bodies 4, detection circuit 72 causes positive electrode side capacitor C1 and negative electrode side capacitor C2 to discharge electricity to reset electric charge in positive electrode side capacitor C1 and negative electrode side capacitor C2. Each time resetting electric charge in positive electrode side capacitor C1 and negative electrode side capacitor C2, detection circuit 72 outputs a pulse signal indicative of detection information to communication I/F 73. Therefore, even when one of operation units 3 is successively operated in plural times, detection circuit 72 can detect a moving direction of the one of operation units 3 in each operation.

(3) Effect

As described above, with input device 1 illustrated in FIG. 1, as one of operation units 3 moves relative to housing 2, together with a corresponding one of operation units 3, a corresponding one of pickers 6 flicks corresponding a one of vibrating bodies 4 to allow the corresponding one of vibrating bodies 4 to vibrate. At this time, vibration energy of the corresponding one of vibrating bodies 4 is converted into electrical energy by each of piezoelectric elements 5. Signal processing unit 7 thus receives power generated by each of piezoelectric elements 5 to operate. Signal processing unit 7 then transmits detection information to be generated as the one of operation units 3 moves to an operation-target device (display device 100) through wireless communications. Therefore, even when no electrical wire is used for coupling input device 1 and the operation-target device, for example, an operator can operate the operation-target device through one of operation units 3. Therefore, without using a touch panel, input device 1 can detect an operation performed with one of operation units 3.

In addition, in input device 1, each of piezoelectric elements 5 generates power in conjunction with a corresponding one of operation units 3. Thus, a battery for driving signal processing unit 7, for example, can be reduced in capacity or can be omitted. Further, since input device 1 transmits detection information, through wireless communications, to an operation-target device (display device 100), a degree of freedom in disposing input device 1 relative to the operation-target device can be increased.

Different from a configuration in which an amount of movement of a terminal provided in an operation unit is detected through a touch panel, as described in PTL 1, input device 1 can provide an operational feeling to an operator operating one of operation units 3. In other words, with pickers 6 each flicking a corresponding one of vibrating bodies 4 as a corresponding one of operation units 3 moves, an operator is provided with an operational feeling, that is, a counterforce (force sense) from the corresponding one of operation units 3 when operating the corresponding one of operation units 3. Therefore, even when click spring 31 is not provided, for example, input device 1 can provide an operational feeling to an operator operating rotation operation unit 301. Similarly, input device 1 can provide an operational feeling to an operator operating push operation unit 302.

Each of piezoelectric elements 5 may output an electrical signal corresponding to vibration of a corresponding one of vibrating bodies 4. Signal processing unit 7 may generate detection information based on the electrical signal. With this configuration, each of piezoelectric elements 5 supplying power to signal processing unit 7 can be commonly used as sensors for detecting an operation performed with each of operation units 3. Therefore, a sensor that detects an operation performed with each of operation units 3, and that is separate from piezoelectric elements 5 is not required. However, similar to a second exemplary embodiment illustrated in FIG. 10, described later, this configuration is not always necessary for input device 1, but sensor 74 configured to detect an operation performed with each of operation units 3 may be provided separately from piezoelectric elements 5. In other words, input device 1 may be configured such that a sensor configured to output an electrical signal corresponding to vibration of each of vibrating bodies 4 is provided separately from each of piezoelectric elements 5 for pickers 6, and, based on an electrical signal generated by the sensor, signal processing unit 7 generates detection information.

In this case, it is preferable that a moving direction of one of operation units 3 and a moving direction of a corresponding one of pickers 6 correspond to each other, and a part of a corresponding one of vibrating bodies 4 lies on an orbital path of the corresponding one of pickers 6 when the corresponding one of pickers 6 moves between the first position and the second position. Further, it is preferable that an electrical signal to be generated when one of pickers 6 moves from the first position to the second position, and flicks a corresponding one of vibrating bodies 4 differs from an electrical signal to be generated when the one of pickers 6 moves from the second position to the first position, and flicks the corresponding one of vibrating bodies 4. In this case, it is preferable that signal processing unit 7 includes detection circuit 72 configured to detect a moving direction of each of operation units 3 based on an electrical signal, and adds a result of detection performed by detection circuit 72 to the detection information, and transmits the detection information. With this configuration, signal processing unit 7 can detect a moving direction of each of operation units 3 based on an electrical signal output from each of piezoelectric elements 5. Therefore, input device 1 is not required to separately include a sensor for detecting a moving direction of each of operation units 3. However, this configuration is not always necessary for input device 1. A function of detecting a moving direction of each of operation units 3 may be omitted.

In this case, it is preferable that, similar to the exemplary embodiment, detection circuit 72 is configured to compare magnitudes of amplitude between first component E1 with positive polarity and second component E2 with negative polarity in an electrical signal, and to detect, based on a result of comparison on the magnitudes of amplitude, a moving direction of each of operation units 3. With this configuration, by separating an electrical signal into a component with positive polarity and a component with negative polarity with a rectifier element, a moving direction of each of operation units 3 can be detected with a relatively simpler configuration.

Similar to the exemplary embodiment, it is preferable that signal processing unit 7 is configured to generate a pulse signal indicative of detection information from a direct current voltage acquired by rectifying and smoothing an electrical signal. With this configuration, an electrical signal output from each of piezoelectric elements 5 is not used as is, but is used to be waveform-shaped into a pulse signal indicative of detection information, allowing input device 1 to operate stably.

Similar to the exemplary embodiment, it is preferable that one of operation units 3 (rotation operation unit 301) is held by housing 2 so as to be rotatable about rotation axis Z1 passing through the one of operation units 3, and each of pickers 6 flicks a corresponding one of vibrating bodies 4 as the one of operation units 3 rotates. With this configuration, input device 1 can detect a rotation operation performed with the one of operation units 3. Therefore, an operator can perform an intuitive operation, compared with an operation on a touch panel, for example. However, this configuration is not always necessary for input device 1, and the one of operation units 3 is not limited to an operation unit for rotation operation.

In this case, similar to the exemplary embodiment, it is preferable that one or more of pickers 6 is provided to a corresponding one of operation units 3 so as to come into contact with a corresponding one of vibrating bodies 4 as the corresponding one of operation units 3 rotates to bend the corresponding one of vibrating bodies 4. With this configuration, as each of pickers 6 bends a corresponding one of vibrating bodies 4, the corresponding one of vibrating bodies 4 can vibrate with elastic force of the corresponding one of vibrating bodies 4. Therefore, each of vibrating bodies 4 can vibrate with a relatively simpler structure. In addition, since each of pickers 6 flicks a corresponding one of vibrating bodies 4 as a corresponding one of operation units 3 rotates, when a rotation operation is performed with the corresponding one of operation units 3, an operator can be provided with an operational feeling, that is, a counterforce (force sense) from the corresponding one of operation units 3. However, this configuration is not always necessary for input device 1. Pickers 6 and operation units 3 may be separate from each other.

Similar to the exemplary embodiment, input device 1 may further includes attaching portion 8 configured to attach housing 2 to attaching surface 101 of an operation-target device (display device 100). With this configuration, since an operator can operate the operation-target device through input device 1 attached to the operation-target device, housing 2 can be kept stable when one of operation units 3 is operated, improving ease of operation. However, this configuration is not always necessary for input device 1, and attaching portion 8 may be omitted.

(4) Modification

Modifications to the first exemplary embodiment will now be described.

Wireless communications to be performed by signal processing unit 7 are not limited to wireless communications using radio waves as a medium, but may be, for example, optical wireless communications using an optical medium, such as infrared ray and visible light. In this case, signal processing unit 7 transmits detection information to display device 100 through optical wireless communications.

In the exemplary embodiment, second printed circuit board 702 and third printed circuit board 703 illustrated in FIG. 2 are not components of signal processing unit 7. However, second printed circuit board 702 and third printed circuit board 703 may be components of signal processing unit 7. In this case, the electronic parts, which are components of signal processing unit 7, are separately installed on first printed circuit board 701, second printed circuit board 702, and third printed circuit board 703.

Power supply circuit 71 illustrated in FIG. 6 may include rectifier elements and capacitors separately from first front circuit 51 and second front circuit 52, or may share rectifier elements and capacitors with first front circuit 51 and second front circuit 52. When rectifier elements and capacitors are shared among first front circuit 51, second front circuit 52, and power supply circuit 71, a combined capacitance of positive electrode side capacitor C1 and negative electrode side capacitor C2 is used for the capacitor for power supply circuit 71, for example.

In the first exemplary embodiment, signal processing unit 7 waveform-shapes an electrical signal output from each of piezoelectric elements 5 into a pulse signal indicative of detection information. However, signal processing unit 7 may use as is an electrical signal output from each of piezoelectric elements 5 to generate detection information. For example, signal processing unit 7 may be configured, upon communication I/F 73 receives power from one of piezoelectric elements 5 and thus starts, to read, with communication I/F 73, detection information stored in a memory, and transmit the detection information. In this case, signal processing unit 7 cannot include information on a moving direction of a corresponding one of operation units 3, for example, in detection information, but can be simplified in configuration.

To waveform-shape an electrical signal output from each of piezoelectric elements 5 into a pulse signal indicative of detection information, signal processing unit 7 may store in a memory operations performed with a corresponding one of operation units 3 in a fixed time, and may generate detection information including a number of operations performed with the corresponding one of operation units 3, for example. In this case, as for each of rotation operation units 301 illustrated in FIG. 1, for example, signal processing unit 7 can count a number of times each of first pickers 601 flicks first vibrating body 401, can convert the counted number into a rotation angle of rotation operation unit 301, for example, and can include the rotation angle in detection information.

Moreover, it is not always necessary that housing 2 includes first case 21, second case 22, and third case 23. Housing 2 may include a single case, two cases, or four or more cases, for example. Further, a coupling structure between first case 21 and second case 22 is not limited to a screw structure, but may be another structure, such as a snap-fit structure for coupling with elastic claws, and laser welding.

Housing 2 may be partially or wholly made of metal. Similarly, rotation operation unit 301 may be partially or wholly made of metal, and push operation unit 302 may be partially or wholly made of metal.

Operation units 3 are not limited to rotation operation unit 301 for rotation operation and push operation unit 302 for push operation, but may be a slide operation unit for slide operation, for example. Further, one of operation units 3 may have a lever structure that is operated by tilting a handle of a toggle switch about a supporting point, for example. In any case, one or more of pickers 6 is configured to flick a second end of a corresponding one of vibrating bodies 4 (a right end in first vibrating body 401 and a left end in second vibrating body 402) in conjunction with a corresponding one of operation units 3 moves.

In addition, input device 1 is not limited to have two operation unite (rotation operation unit 301 and push operation unit 302) as illustrated in the first exemplary embodiment, but may have three or more operation units 3. When input device 1 includes a plurality of operation units 3, the plurality of operation units 3 may be structured identically (e.g., may all be used for rotation operation). Otherwise, input device 1 may include only one operation unit 3.

In the first exemplary embodiment, vibrating bodies 4 are flat plates. However, this configuration is merely an example. Vibrating bodies 4 may be curved or bent partially. Vibrating bodies 4 may not each be provided with weight 41.

Second Exemplary Embodiment

Figure 10:
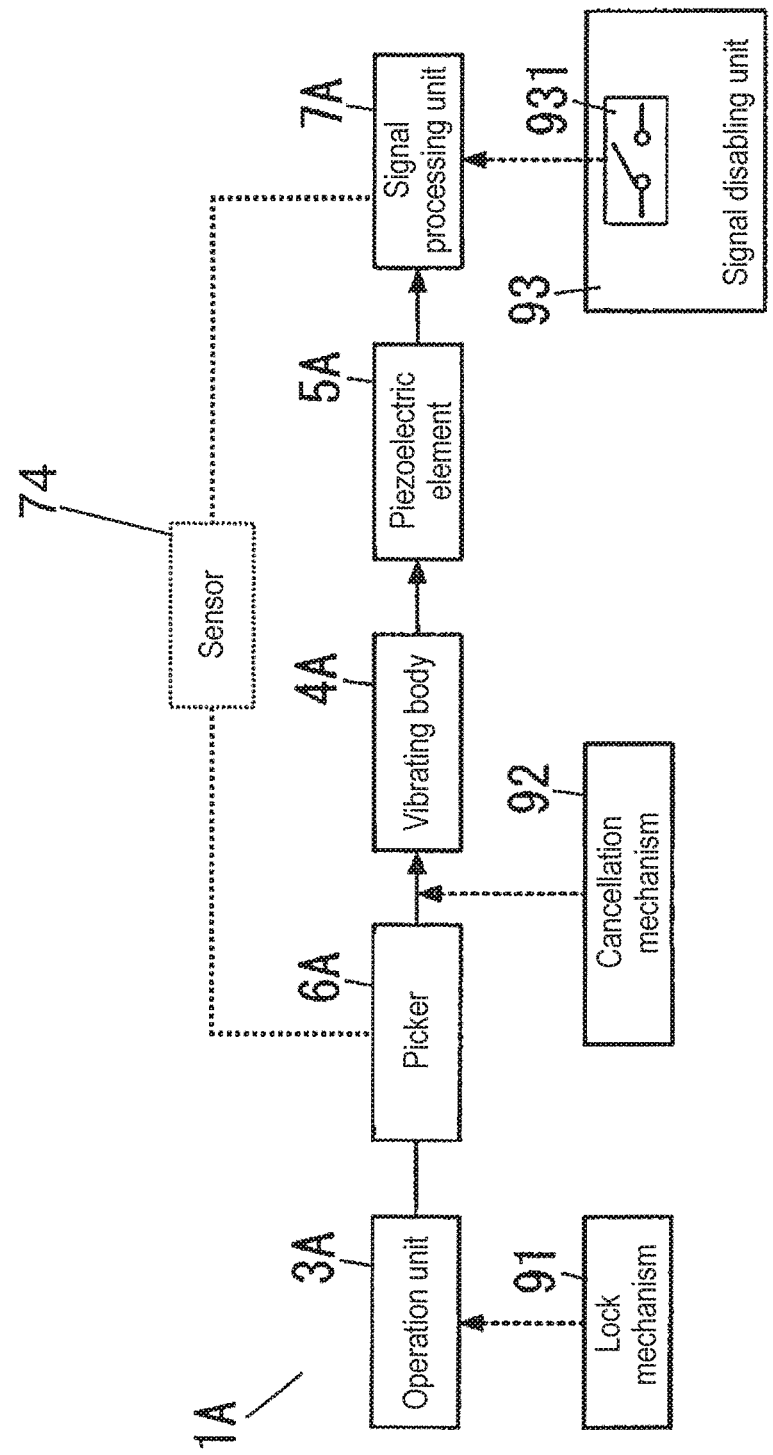
FIG. 10 is a block diagram of an input device according to a second exemplary embodiment of the present invention.
Figure 11A:
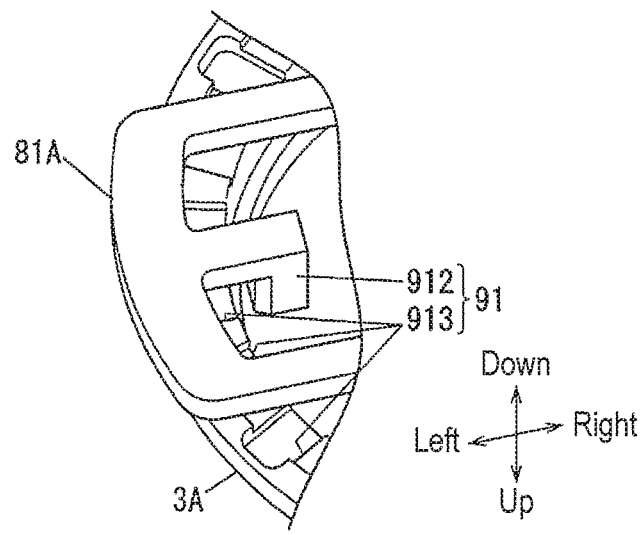
FIG. 11A is a perspective view of a principal portion of the input device in FIG. 10 in a fully fixed state, when viewed from below.
Figure 11B:
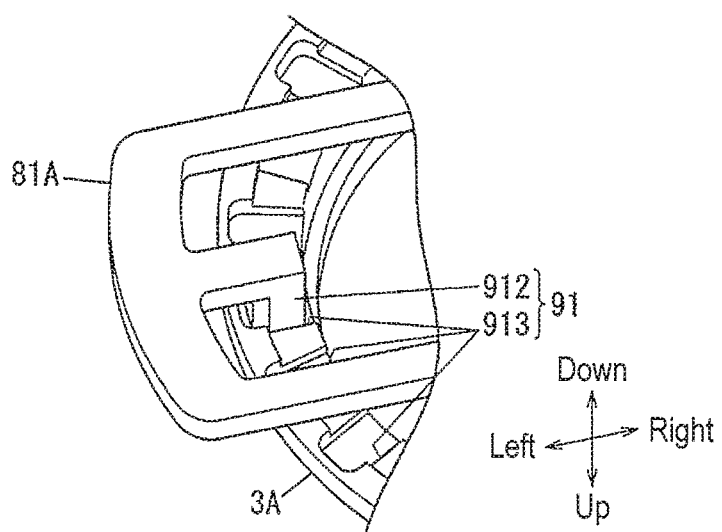
FIG. 11B is a perspective view of the principal portion of the input device in FIG. 10 in a positioning state, when viewed from below.

Input device 1A according to a second exemplary embodiment of the present invention will now be described with reference to FIGS. 10, 11A, and 11B. FIG. 10 is a block diagram of input device 1A. FIG. 11A is a perspective view of a principal portion of the input device in FIG. 10 in a fully fixed state when viewed from below. FIG. 11B is a perspective view of the principal portion of the input device in FIG. 10 in a positioning state when viewed from below.

Input device 1A includes an erroneous operation suppression unit configured to suppress detection information from being erroneously transmitted when operation unit 3A is not operated, and thus differs from input device 1 according to the first exemplary embodiment. Hereinafter, elements similar to those in the first exemplary embodiment are given identical reference signs, and description of such elements is omitted as appropriate. "Operation unit 3A", "vibrating body 4A", "piezoelectric element 5A", "picker 6A", "signal processing unit 7A", and "slider 81A" respectively correspond to "operation unit 3", "vibrating body 4", "piezoelectric element 5", "picker 6", "signal processing unit 7", and "slider 81" in the first exemplary embodiment.

As illustrated in FIG. 10, input device 1A includes, as an erroneous operation suppression unit, at least one of lock mechanism 91, cancellation mechanism 92, and signal disabling unit 93. Input device 1A may include only one of or two or more of lock mechanism 91, cancellation mechanism 92, and signal disabling unit 93.

Lock mechanism 91 includes a movable member that is movable relative to housing 2. Lock mechanism 91 is configured to allow a movable member to move to perform switching between a state at which operation unit 3A is stopped from moving relative to housing 2 and a state at which operation unit 3A is not stopped from moving relative to housing 2. The movable member is slider 81A illustrated in FIG. 11A, for example. A specific example of lock mechanism 91 will now be described in detail with reference to FIGS. 11A and 11B.

Operation unit 3A is a rotation operation unit. As illustrated in FIG. 1A, lock mechanism 91 includes a plurality of first stopping portions 913 provided to operation unit 3A, and second stopping portion 912 provided to a movable member (slider 81A in here). As illustrated in FIG. 11B, lock mechanism 91 is configured to stop operation unit 3A from moving relative to housing 2 when one of the plurality of first stopping portions 913 fits into second stopping portion 912. The plurality of first stopping portions 913 are provided at predetermined intervals in a moving direction of operation unit 3A.

FIGS. 11A and 11B illustrate that the plurality of first stopping portions 913 are provided on an outer circumferential portion on a lower surface of operation unit 3A at even intervals in a circumferential direction of operation unit 3A. Each of the plurality of first stopping portions 913 is a recess recessed upward, and is open toward a rotation axis of operation unit 3A. Second stopping portion 912 is provided on a left end of slider 81A served as a movable member, and is a projection projecting upward from an upper surface of slider 81A. A top end (upper end) of second stopping portion 912 is partially cut away (not shown). The top end of second stopping portion 912 therefore enters into lower side recess 36 of operation unit 3A, identically to FIG. 1.

Therefore, when slider 81A lies at a right end position of a movable range (fully fixed state), as illustrated in FIG. 11A, second stopping portion 912 do not fit to either of the plurality of first stopping portions 913, operation unit 3A is thus movable (rotatable) in the circumferential direction. In other words, lock mechanism 91 does not stop operation unit 3A from moving relative to housing 2, and thus a rotation operation can be performed with operation unit 3A. On the other hand, when slider 81A lies at a left end position of the movable range (positioning state), as illustrated in FIG. 11B, second stopping portion 912 fits to one of the plurality of first stopping portions 913, and thus operation unit 3A is stopped from moving in the circumferential direction. In other words, lock mechanism 91 stops operation unit 3A from moving relative to housing 2, and thus a rotation operation with operation unit 3A is restricted.

With this configuration, lock mechanism 91 can stop operation unit 3A from moving relative to housing 2, and detection information can be suppressed from being erroneously transmitted when operation unit 3 is not operated. For example, even when an operator grabs operation unit 3A in attaching input device 1A to display device 100, detection information can be suppressed from being erroneously transmitted as long as operation unit 3A is stopped from moving. The plurality of first stopping portions 913 are provided at predetermined intervals in the moving direction of operation unit 3A. Therefore, after operation unit 3A is operated, and operation unit 3A remains almost unmoved, lock mechanism 91 can stop operation unit 3A from moving relative to housing 2.

An unevenness relationship between the plurality of first stopping portions 913 and second stopping portion 912 may be reversed from the relationship exemplified in FIG. 11A. In other words, the plurality of first stopping portions 913 may be projections, while second stopping portion 912 may be a recess.

Cancellation mechanism 92 illustrated in FIG. 10 includes a movable member (e.g., slider 81A) that is movable relative to housing 2. Cancellation mechanism 92 allows the movable member to move to perform switching between a state at which, as operation unit 3A moves, picker 6A flicks vibrating body 4A and a state at which picker 6A does not flick vibrating body 4A along with operation unit 3A.

Specifically, cancellation mechanism 92 can be achieved by allowing at least either of picker 6A and vibrating body 4A to move together with slider 81A, for example. For example, cancellation mechanism 92 allows vibrating body 4A to move together with slider 81A to move between a position on an orbital path of picker 6A and a position off the orbital path of picker 6A. It is preferable that, when slider 81A lies at the right end position of the movable range (fully fixed state), vibrating body 4A lies on the orbital path of picker 6A. It is also preferable that, when slider 81A lies at the left end position of the movable range (positioning state), vibrating body 4A lies off the orbital path of picker 6A. Therefore, in the fully fixed state picker 6A flicks vibrating body 4A in conjunction with operation unit 3A. On the other hand, in the positioning state, picker 6A does not flick vibrating body 4A along with operation unit 3A.

With this configuration, when cancellation mechanism 92 selects the state at which picker 6A does not flick vibrating body 4A along with operation unit 3A, detection information can be suppressed from being erroneously transmitted when operation unit 3 is not operated. For example, even when an operator grabs operation unit 3A in attaching input device 1A to display device 100, and operation unit 3A moves unintentionally, detection information can be suppressed from being erroneously transmitted as long as picker 6A is not able to flick vibrating body 4A.

Signal disabling unit 93 includes a movable member (e.g., slider 81A) that is movable relative to housing 2. Signal disabling unit 93 allows disabling switch 931 (see FIG. 10) to move together with the movable member to perform switching between a state at which signal processing unit 7A transmits detection information and a state at which signal processing unit 7A does not transmit detection information.

Specifically, disabling switch 931 is a mechanical switch configured to move together with slider 81A to perform switching between on and off. By turning on or off disabling switch 931, signal disabling unit 93 performs switching between the state at which signal processing unit 7A transmits detection information, and the state at which signal processing unit 7A does not transmit detection information. It is preferable that, when slider 81A lies at the right end position of the movable range (fully fixed state), signal processing unit 7A transmits detection information. It is also preferable that, when slider 81A lies at the left end position of the movable range (positioning state), signal processing unit 7A does not transmit detection information.

With this configuration, when signal disabling unit 93 selects the state at which signal processing unit 7A does not transmit detection information, detection information can be suppressed from being erroneously transmitted when operation unit 3A is not operated. For example, even when an operator grabs operation unit 3A in attaching input device 1A to display device 100, and operation unit 3A moves unintentionally, detection information can be suppressed from being erroneously transmitted as long as signal processing unit 7A does not transmit detection information.

Similar to the exemplary embodiment, it is preferable that the movable member is slider 81A configured to change a holding force applied by attaching portion 8 from input device 1A to display device 100. Therefore, at the positioning state, the erroneous operation suppression unit can suppress detection information from being erroneously transmitted when operation unit 3A is not operated. Therefore, even when an operator grabs operation unit 3A in a state that input device 1A is removed from display device 100, for example, detection information can be suppressed from being erroneously transmitted.

However, slider 81A being used as the movable member is not a necessary configuration for input device 1A. The movable member may be provided separately from slider 81A.

Other configurations and functions are similar to those of the first exemplary embodiment. The configuration described in the second exemplary embodiment is applicable by being appropriately combined with the respective configurations (including modifications) described in the first exemplary embodiment.

Third Exemplary Embodiment

Figure 12:
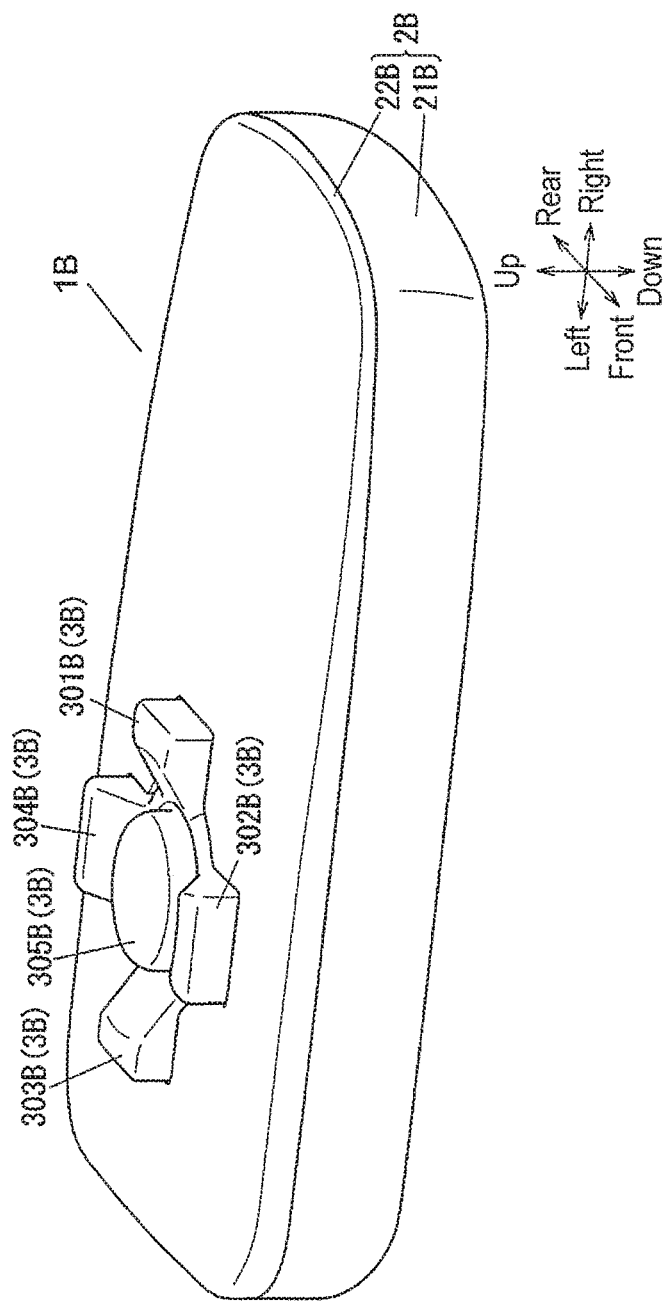
FIG. 12 is a perspective view of an input device according to a third exemplary embodiment of the present invention.
Figure 13:
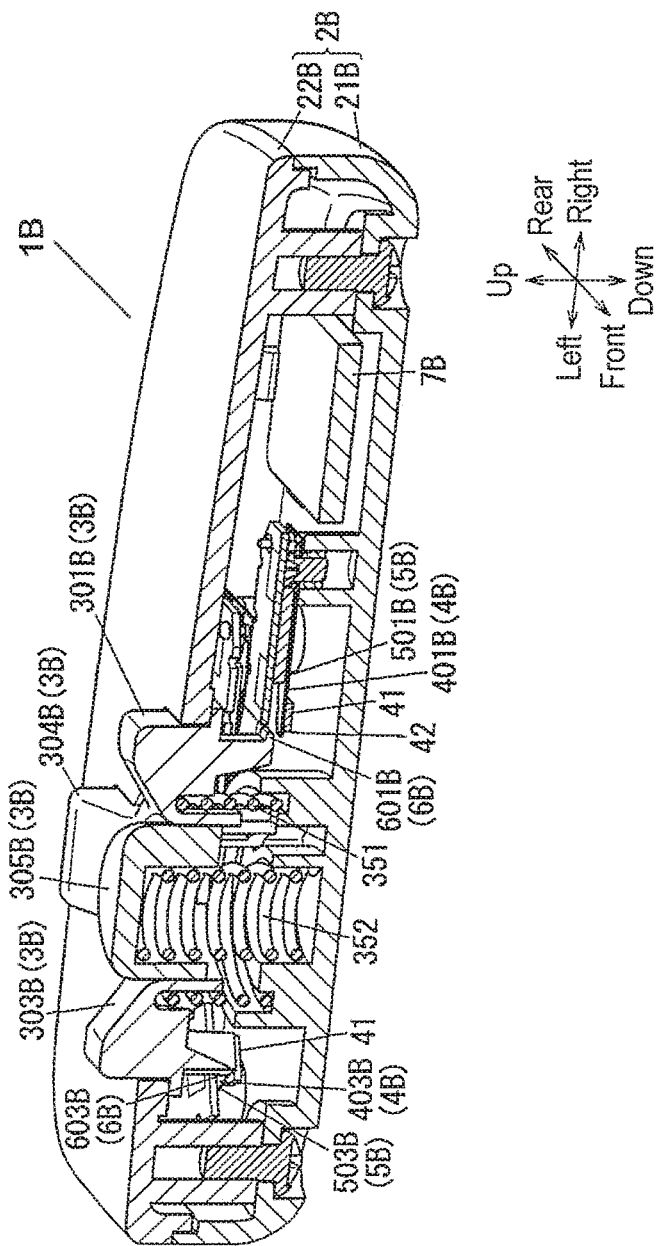
FIG. 13 is a cross-sectional perspective view of the input device in FIG. 12.

Input device 1B according to a third exemplary embodiment of the present invention will now be described with reference to FIGS. 12 and 13. FIG. 12 is a perspective view of input device 1B. FIG. 13 is a cross-sectional perspective view of input device 1B. Input device 1B differs from input device 1 according to the first exemplary embodiment in that, as illustrated in FIG. 12, a plurality of operation units 3B for push operation are included. Hereinafter, elements similar to those in the first exemplary embodiment are given identical reference signs, and description of such elements is omitted as appropriate. "Housing 2B", "operation unit 3B", "vibrating body 4B", "piezoelectric element 5B", "picker 6B", and "signal processing unit 7B" described below respectively correspond to "housing 2", "operation unit 3", "vibrating body 4", "piezoelectric element 5", "picker 6", and "signal processing unit 7" in the first exemplary embodiment.

Input device 1B is held by an operator for use as a remote controller to remotely operate an operation-target device. Housing 2B of input device 1B is made of a synthetic resin, for example. Housing 2B includes first case 21B and second case 22B. First case 21B and second case 22B are assembled in the up-down direction to form housing 2B that has a rectangular shape with flat surfaces facing the up-down direction and that extends longer in the left-right direction. Operation units 3B project upward from an upper surface of housing 2B. Housing 2B may be partially or wholly made of metal.

Input device 1B includes five operation units 3B for push operation. Among five operation units 3B, operation units 301B, 302B, 303B, 304B configure a cross-key capable of instructing four directions. Operation units 301B, 302B, 303B, 304B are integrally coupled in an annular shape. Operation unit 305B is disposed at a position surrounded by four operation units 301B, 302B, 303B, 304B. When operation units 301B, 302B, 303B, 304B, 305B are not particularly distinguished, the operation units are collectively referred to as "operation units 3B".

As illustrated in FIG. 13, input device 1B includes, in housing 2B, support spring 351 configured to support operation units 301B, 302B, 303B, 304B. Input device 1B further includes, in housing 2B, return spring 352 configured to allow, when a push operation is performed with operation unit 305B, operation unit 305B to return to a position (reference position) at which operation unit 305B has lied before the operation has been performed. Support spring 351 and return spring 352 are coil springs, for example.

One of vibrating bodies 4B, one of piezoelectric elements 5B, and one of pickers 6B are respectively provided to each of five operation units 3B. For example, operation unit 301B is provided with vibrating body 401B, piezoelectric element 501B, and picker 601B. Operation unit 303B is provided with vibrating body 403B, piezoelectric element 503B, and picker 603B. In other words, input device 1B includes five vibrating bodies 4B, five piezoelectric elements 5B, and five pickers 6B. Vibrating bodies 4B, piezoelectric elements 5B, and signal processing unit 7B are accommodated in housing 2B.

Each of pickers 6B and corresponding each of operation units 3B are integrally formed. A relative positional relationship between each of pickers 6B and each of vibrating bodies 4B is set so that, as one of operation units 3B moves, a corresponding one of pickers 6B flicks a second end (contactor 42) of a corresponding one of vibrating bodies 4B toward a thickness direction of the corresponding one of vibrating bodies 4B. Therefore, when one of operation units 3B is operated, a corresponding one of pickers 6B flicks a corresponding one of vibrating bodies 4B to allow the corresponding one of vibrating bodies 4B to vibrate. For example, when a push operation is performed with operation unit 301B, picker 601B allows vibrating body 401B to vibrate, and accordingly piezoelectric element 501B generates power. When a push operation is performed with operation unit 303B, picker 603B allows vibrating body 403B to vibrate, and accordingly piezoelectric element 503B generates power.

Signal processing unit 7B is electrically coupled to five piezoelectric elements 5B. With separate terminals through which electrical signals sent from five piezoelectric elements 5B enter into signal processing unit 7, for example, signal processing unit 7B generates detection information. Therefore, with detection information, which of five operation units 3B is operated can be identified.

Further, signal processing unit 7B is configured to detect a moving direction of each of operation units 3B based on an electrical signal sent from a corresponding one of piezoelectric elements 5B. In other words, when one of operation units 3B is pushed downward, a corresponding one of pickers 6B moves from the first position to the second position. At this time, the corresponding one of pickers 6B comes into contact with a corresponding one of vibrating bodies 4B to flick downward the corresponding one of vibrating bodies 4B. From this state, when the push operation performed by the operator with the one of operation units 3B is cancelled (the operator releases his or her hand or finger from the one of operation units 3B), the corresponding one of pickers 6B moves from the second position to the first position. At this time, the corresponding one of pickers 6B comes into contact with the corresponding one of vibrating bodies 4B to flick upward the corresponding one of vibrating bodies 4B. With a configuration similar to the configuration described in "(2.3) Signal processing unit" in the first exemplary embodiment, signal processing unit 7B detects, based on a direction toward which one of pickers 6B has flicked a corresponding one of vibrating bodies 4B, a moving direction of a corresponding one of operation units 3B.

With input device 1B according to the above described exemplary embodiment, detection information corresponding to a push operation performed with each of the plurality of (five in here) operation units 3B can be transmitted to the operation-target device through wireless communications. Detection information includes information indicative of an operation performed with one of the plurality of operation units 3B and information indicative of a moving direction of the one of the plurality of operation units 3B. Therefore, when an operator operates operation unit 301B, for example, input device 1B can separately detect whether the operator has pushed operation unit 301B or the operator has released his or her hand or finger from operation unit 301B. Therefore, the operation-target device can be controlled so that, while an operator is pushing operation unit 301B, for example, a cursor moves in a direction corresponding to operation unit 301B, and, when the operator has released his or her hand or finger from operation unit 301B, the cursor stops.

Other configurations and functions are similar to those of the first exemplary embodiment. The configuration described in the third exemplary embodiment is applicable by being appropriately combined with the respective configurations (including modifications) described in the first and second exemplary embodiments.

REFERENCE MARKS IN THE DRAWINGS

1, 1A, 1B: input device
2, 2B: housing
3, 3A, 3B, 301, 302, 301B, 302B, 303B, 304B, 305B: operation unit
4, 4A, 4B, 401, 401B, 402, 403B: vibrating body
5, 5A, 5B, 501, 501B, 502, 503B: piezoelectric element
6, 6A, 6B, 601, 601B, 602, 603B: picker
7, 7A, 7B: signal processing unit
8: attaching portion
72: detection circuit
81, 81A: slider (movable member)
91: lock mechanism
92: cancellation mechanism
93: signal disabling unit
100: display device (operation-target device)
101: attaching surface
913: first stopping portion
912: second stopping portion
931: disabling switch

The invention claimed is:

1. An input device comprising:
a housing;
an operation unit that is movable relative to the housing;
a vibrating body having elasticity, the vibrating body including a first end fixed to the housing and a second end being not fixed to the housing so as to be vibratable;
a picker provided so as to be movable relative to the housing in conjunction with the operation unit, the picker flicking the vibrating body to allow the vibrating body to vibrate;
a piezoelectric element provided to the vibrating body, the piezoelectric element being configured to convert vibration energy of the vibrating body into electrical energy; and
signal processing circuitry configured to receive power generated by the piezoelectric element to operate and transmit, through wireless communications, detection information to be generated as the operation unit moves, wherein:
a moving direction of the operation unit is identical to a moving direction of the picker,
the second end of the vibrating body lies on an orbital path of the picker when the picker moves between a first position and a second position,
when the picker moves from the first position to the second position and flicks the vibrating body, the piezoelectric element outputs a first electrical signal,
when the picker moves from the second position to the first position and flicks the vibrating body, the piezoelectric element outputs a second electrical signal,
the signal processing circuitry is configured to generate the detection information based the first electrical signal and the second electrical signal,
the signal processing circuitry includes a detection circuit configured to compare a magnitude of amplitude of a first component with positive polarity in the first electrical signal with a magnitude of amplitude of a second component with negative polarity in the first electrical signal and configured to compare a magnitude of amplitude of a first component with positive polarity in the second electrical signal with a magnitude of amplitude of a second component with negative polarity in the second electrical signal, and
the detection circuit detects a moving direction of the operation unit based on a result of comparison in the detection circuit regarding the first electrical signal and a result of comparison in the detection circuit regarding the second electrical signal.

2. The input device according to claim 1, wherein the signal processing circuitry is configured to use a direct current voltage acquired by rectifying and smoothing each of the first electrical signal and the second electrical signal to generate a pulse signal indicative of the detection information.

3. The input device according to claim 1,
wherein the operation unit is held by the housing so as to be rotatable about a rotation axis passing through the operation unit, and
wherein the picker is disposed so as to flick the vibrating body at a time of rotation of the operation unit.

4. The input device according to claim 3,
wherein the picker is provided to the operation unit, and
wherein the picker bends the vibrating body so as to come into contact with the vibrating body at the time of the rotation of the operation unit.

5. The input device according to claim 1, further comprising a lock mechanism including a movable member that is movable relative to the housing,
wherein the lock mechanism performs switching between a state at which the lock mechanism stops movement of the operation unit relative to the housing and a state at which the lock mechanism allows the movement of the operation unit relative to the housing, and
wherein the switching is caused by the movement of the movable member.

6. The input device according to claim 5,
wherein the lock mechanism includes:
a plurality of first stopping portions provided to the operation unit; and
a second stopping portion provided to the movable member,
wherein the lock mechanism is configured to stop the movement of the operation unit relative to the housing when one of the plurality of first stopping portions fits into the second stopping portion, and
wherein the plurality of first stopping portions are provided at predetermined intervals in the moving direction of the operation unit.

7. A input device comprising:
a housing;
an operation unit that is movable relative to the housing;
a vibrating body having elasticity, the vibrating body including a first end fixed to the housing;

a picker provided so as to be movable relative to the housing in conjunction with the operation unit, the picker flicking the vibrating body to allow the vibrating body to vibrate;

a piezoelectric element provided to the vibrating body, the piezoelectric element being configured to convert vibration energy of the vibrating body into electrical energy;

signal processing circuitry configured to receive power generated by the piezoelectric element to operate and transmit, through wireless communications, detection information to be generated as the operation unit moves; and a cancellation mechanism including a movable member that is movable relative to the housing, wherein the cancellation mechanism performs switching between a state at which the picker flicks the vibrating body along with the operation unit and a state at which the picker does not flick the vibrating body along with the operation unit, and wherein the switching is caused by the movement of the movable member.

8. The input device according to claim 1, further comprising:

a movable member that is movable relative to the housing; and a signal disabling unit including a disabling switch configured to move together with the movable member, wherein the signal disabling unit causes the disabling switch to perform switching between a state at which the signal processing circuitry transmits the detection information and a state at which the signal processing circuitry does not transmit the detection information.

9. The input device according to claim 1, further comprising a sensor configured to generate an electrical signal as the vibrating body vibrates, wherein the signal processing circuitry generates the detection information based on an electrical signal generated by the sensor.

10. The input device according to claim 1, further comprising an attaching portion configured to attach the housing to an operation-target device.

11. An input device comprising:

a housing;

an operation unit that is movable relative to the housing;

a vibrating body having elasticity, the vibrating body including a first end fixed to the housing;

a picker provided so as to be movable relative to the housing in conjunction with the operation unit, the picker flicking the vibrating body to allow the vibrating body to vibrate;

a piezoelectric element provided to the vibrating body, the piezoelectric element being configured to convert vibration energy of the vibrating body into electrical energy; and signal processing circuitry configured to receive power generated by the piezoelectric element to operate and transmit, through wireless communications, detection information to be generated as the operation unit moves, wherein the vibration body and the piezoelectric element are provided in a space surrounded by the housing and the operation unit and located under the operation unit, and operation unit includes a first unit that is rotatable along a rotation axis and a second unit that is movable along the rotation axis.

12. The input device according to claim 11, wherein the vibrating body further includes a second end which is not fixed to the housing so as to be vibratable.

13. The input device according to claim 12, wherein the piezoelectric element is configured to output a plurality of electrical signals respectively corresponding to various vibrations of the vibrating body.

* * * * *